(12) United States Patent
Watanabe

(10) Patent No.: US 12,382,617 B2
(45) Date of Patent: Aug. 5, 2025

(54) COOLING CONTROL DEVICE, COOLING SYSTEM, PROGRAM, AND CONTROL METHOD

(71) Applicant: DENSO CORPORATION, Kariya (JP)

(72) Inventor: Toshihide Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 500 days.

(21) Appl. No.: 17/858,284

(22) Filed: Jul. 6, 2022

(65) Prior Publication Data

US 2022/0338392 A1    Oct. 20, 2022

Related U.S. Application Data

(63) Continuation of application No. PCT/JP2020/049141, filed on Dec. 28, 2020.

(30) Foreign Application Priority Data

Jan. 6, 2020 (JP) .................. 2020-000455
Jul. 31, 2020 (JP) .................. 2020-130846

(51) Int. Cl.
*H05K 7/20* (2006.01)
*B60K 1/00* (2006.01)
*B60K 11/02* (2006.01)

(52) U.S. Cl.
CPC ..... *H05K 7/20945* (2013.01); *H05K 7/20927* (2013.01); *B60K 1/00* (2013.01); *B60K 2001/006* (2013.01); *B60K 11/02* (2013.01)

(58) Field of Classification Search
CPC .. H05K 7/20945; H05K 7/20927; B60K 1/00; B60K 11/02; B60K 2001/006
See application file for complete search history.

(56) References Cited

U.S. PATENT DOCUMENTS

2013/0333960 A1* 12/2013 Kasperek ........... B60K 15/0409
                                                                  220/288
2021/0323381 A1* 10/2021 Orihashi ............ B60H 1/00485
2022/0219526 A1*  7/2022 Honjo ................ B60H 1/00278

FOREIGN PATENT DOCUMENTS

JP        2008-213583 A      9/2008
JP        2019023059 A   *  2/2019 ............... B60H 1/22

* cited by examiner

*Primary Examiner* — Raheena R Malik
(74) *Attorney, Agent, or Firm* — Oliff PLC

(57) ABSTRACT

A first cooling circuit is provided with a first coolant passage, and a second cooling circuit is provided with a second coolant passage. A connection path is provided between them. A cooling control device includes a current amount calculation part that calculates a required amount of current of an electric drive unit; a coolant temperature determination part that determines a necessary coolant temperature, which is a temperature of the coolant to flow in the second coolant passage, according to the required amount of current; and a system control part that acquires a temperature of the coolant before being supplied to the electric drive unit cooling part as a second coolant temperature, and, when the second coolant temperature is higher than the necessary coolant temperature, controls the path control device so that the coolant flows from the first coolant passage to the second coolant passage via the connection path.

16 Claims, 15 Drawing Sheets

COOLING CONTROL DEVICE, COOLING SYSTEM, PROGRAM, AND CONTROL METHOD

CROSS-REFERENCE TO RELATED APPLICATION

This application is the U.S. bypass application of International Application No. PCT/JP2020/049141 filed on Dec. 28, 2020 which designated the U.S. and claims priority to Japanese Patent Application No. 2020-000455 filed on Jan. 6, 2020 and Japanese Patent Application No. 2020-130846 filed on Jul. 31, 2020, the contents of all of which are incorporated herein by reference.

TECHNICAL FIELD

The present disclosure relates to a cooling control device, a cooling system, a program, and a control method.

BACKGROUND

Electric vehicles and hybrid vehicles having a storage battery and powered by a motor are conventionally known. As shown in JP 2019-23059 A, these vehicles are provided with a cooling circuit for cooling an electric drive unit including the motor, the inverter, and the like, and a cooling circuit for cooling the storage battery. Generally, the cooling circuit for cooling the electric drive unit and the cooling circuit for cooling the storage battery are provided so that their coolants circulate independently because they have different required coolant temperatures.

However, in some situations, it may be preferable that a coolant circulates for both cooling circuits. For example, in the cooling circuit of JP 2019-23059 A, in winter, a coolant heated by the heat released from the electric drive unit is used to heat the storage battery to recover the waste heat and improve energy efficiency.

SUMMARY

An aspect of the present disclosure provides a cooling control device configured to control a cooling system having a first cooling circuit that cools a cooling target and a second cooling circuit that cools an electric drive unit. The cooling control device includes a first coolant passage provided in the first cooling circuit configured to circulate a coolant between a first cooling part configured to cool the cooling target and a first heat exchanger, a second coolant passage provided in the second cooling circuit configured to circulate a coolant between an electric drive unit cooling part configured to cool the electric drive unit and a second heat exchanger, the first heat exchanger and the second heat exchanger are each a device that releases heat from the coolant, and the first heat exchanger is configured to lower a temperature of the coolant so that the temperature of the coolant after releasing heat is lower than a temperature of the coolant whose heat has been released by the second heat exchanger, a connection path configured to connect the first coolant passage and the second coolant passage is provided between the first coolant passage and the second coolant passage, and a path control device configured to control a coolant flow in the connection path. The cooling control device further includes a current amount calculation part configured to calculate a required amount of current of the electric drive unit; a coolant temperature determination part configured to determine a necessary coolant temperature, which is a temperature of the coolant to flow in the second coolant passage, according to the required amount of current calculated by the current amount calculation part; and a system control part configured to acquire a temperature of the coolant in the second coolant passage after being supplied from the second heat exchanger and before being supplied to the electric drive unit cooling part as a second coolant temperature, and, when the second coolant temperature is higher than the determined necessary coolant temperature, controls the path control device so that the coolant flows from the first coolant passage to the second coolant passage via the connection path.

Another aspect of the present disclosure provides a cooling control device configured to control a cooling system having a first cooling circuit that cools a cooling target and a second cooling circuit that cools an electric drive unit. The cooling control device includes a first coolant passage provided in the first cooling circuit configured to circulate a coolant between a first cooling part configured to cool the cooling target and a first heat exchanger, a second coolant passage provided in the second cooling circuit configured to circulate a coolant between an electric drive unit cooling part configured to cool the electric drive unit and a second heat exchanger, the first heat exchanger and the second heat exchanger are each a device that releases heat from the coolant, and the first heat exchanger is configured to lower a temperature of the coolant so that the temperature of the coolant after releasing heat is lower than a temperature of the coolant whose heat has been released by the second heat exchanger, and a heat transfer device configured to transfer a temperature of the coolant in the first coolant passage to a temperature of the coolant in the second coolant passage is provided between the first coolant passage and the second coolant passage. The cooling control device further includes a current amount calculation part configured to calculate a required amount of current of the electric drive unit; a coolant temperature determination part configured to determine a necessary coolant temperature, which is a temperature of the coolant to flow in the second coolant passage, according to the required amount of current calculated by the current amount calculation part; and a system control part configured to acquire a temperature of the coolant in the second coolant passage after being supplied from the second heat exchanger and before being supplied to the electric drive unit cooling part as a second coolant temperature, and, when the second coolant temperature is higher than the determined necessary coolant temperature, controls the heat transfer device so as to transfer the temperature of the coolant in the first coolant passage to the temperature of the coolant in the second coolant passage.

Yet another aspect of the present disclosure provides a cooling system including a first cooling circuit having a first cooling part configured to cool a cooling target, a first heat exchanger, and a first coolant passage in which a coolant circulates between the first cooling part and the first heat exchanger; a second cooling circuit having an electric drive unit cooling part configured to cool an electric drive unit, a second heat exchanger, and a second coolant passage in which a coolant circulates between the electric drive unit cooling part and the second heat exchanger; a connection path configured to connect the first coolant passage and the second coolant passage; a path control device configured to control a coolant flow through the connection path; and a cooling control device configured to control the path control device, wherein the first heat exchanger and the second heat exchanger are each a device that releases heat from the coolant, and the first heat exchanger is configured to lower a temperature of the coolant so that the temperature of the coolant after releasing heat is lower than a temperature of the coolant whose heat has been released by the second heat exchanger, and the cooling control device includes a current amount calculation part configured to calculate a required amount of current of the electric drive unit, a coolant temperature determination part configured to determine a necessary coolant temperature, which is a temperature of the coolant to flow in the second coolant passage, according to the required amount of current calculated by the current amount calculation part, and a system control part configured to acquire a temperature of the coolant in the second coolant passage after being supplied from the second heat exchanger and before being supplied to the electric drive unit cooling part as a second coolant temperature, and, when the second coolant temperature is higher than the determined necessary coolant temperature, controls the path control device so that the coolant flows from the first coolant passage to the second coolant passage.

Yet another aspect of the present disclosure provides a program executed by a cooling control device configured to control a cooling system having a first cooling circuit that cools a cooling target and a second cooling circuit that cools an electric drive unit. The cooling control device includes a first coolant passage provided in the first cooling circuit configured to circulate a coolant between a first cooling part configured to cool the cooling target and a first heat exchanger, a second coolant passage provided in the second cooling circuit configured to circulate a coolant between an electric drive unit cooling part configured to cool the electric drive unit and a second heat exchanger, the first heat exchanger and the second heat exchanger are each a device that releases heat from the coolant, and the first heat exchanger is configured to lower a temperature of the coolant so that the temperature of the coolant after releasing heat is lower than a temperature of the coolant whose heat has been released by the second heat exchanger, a connection path configured to connect the first coolant passage and the second coolant passage is provided between the first coolant passage and the second coolant passage, and a path control device configured to control a coolant flow through the connection path. The program includes a current amount calculation step for calculating a required amount of current of the electric drive; a coolant temperature determination step for determining a necessary coolant temperature, which is a temperature of the coolant to flow in the second coolant passage, according to the required amount of current calculated in the current amount calculation step; and a system control step for acquiring a temperature of the coolant in the second coolant passage after being supplied from the second heat exchanger and before being supplied to the electric drive unit cooling part as a second coolant temperature, and, when the second coolant temperature is higher than the determined necessary coolant temperature, controlling the path control device so that the coolant flows from the first coolant passage to the second coolant passage.

Yet another aspect of the present disclosure provides a control method performed by a cooling control device configured to control a cooling system having a first cooling circuit that cools a cooling target and a second cooling circuit that cools an electric drive unit. The cooling control device includes a first coolant passage provided in the first cooling circuit configured to circulate a coolant between a first cooling part configured to cool the cooling target and a first heat exchanger, a second coolant passage provided in the second cooling circuit configured to circulate a coolant between an electric drive unit cooling part configured to cool the electric drive unit and a second heat exchanger, the first heat exchanger and the second heat exchanger are each a device that releases heat from the coolant, and the first heat exchanger is configured to lower a temperature of the coolant so that the temperature of the coolant after releasing heat is lower than a temperature of the coolant whose heat has been released by the second heat exchanger, a connection path configured to connect the first coolant passage and the second coolant passage is provided between the first coolant passage and the second coolant passage, and a path control device configured to control a coolant flow in the connection path. The method includes a current amount calculation step for calculating a required amount of current of the electric drive; a coolant temperature determination step for determining a necessary coolant temperature, which is a temperature of the coolant to flow in the second coolant passage, according to the required amount of current calculated in the current amount calculation step; and a system control step for acquiring a temperature of the coolant in the second coolant passage after being supplied from the second heat exchanger and before being supplied to the electric drive unit cooling part as a second coolant temperature, and, when the second coolant temperature is higher than the determined necessary coolant temperature, controlling the path control device so that the coolant flows from the first coolant passage to the second coolant passage.

BRIEF DESCRIPTION OF THE DRAWINGS

The above features of the present disclosure will be made clearer by the following detailed description, given referring to the appended drawings. In the accompanying drawings.

Figure 1:
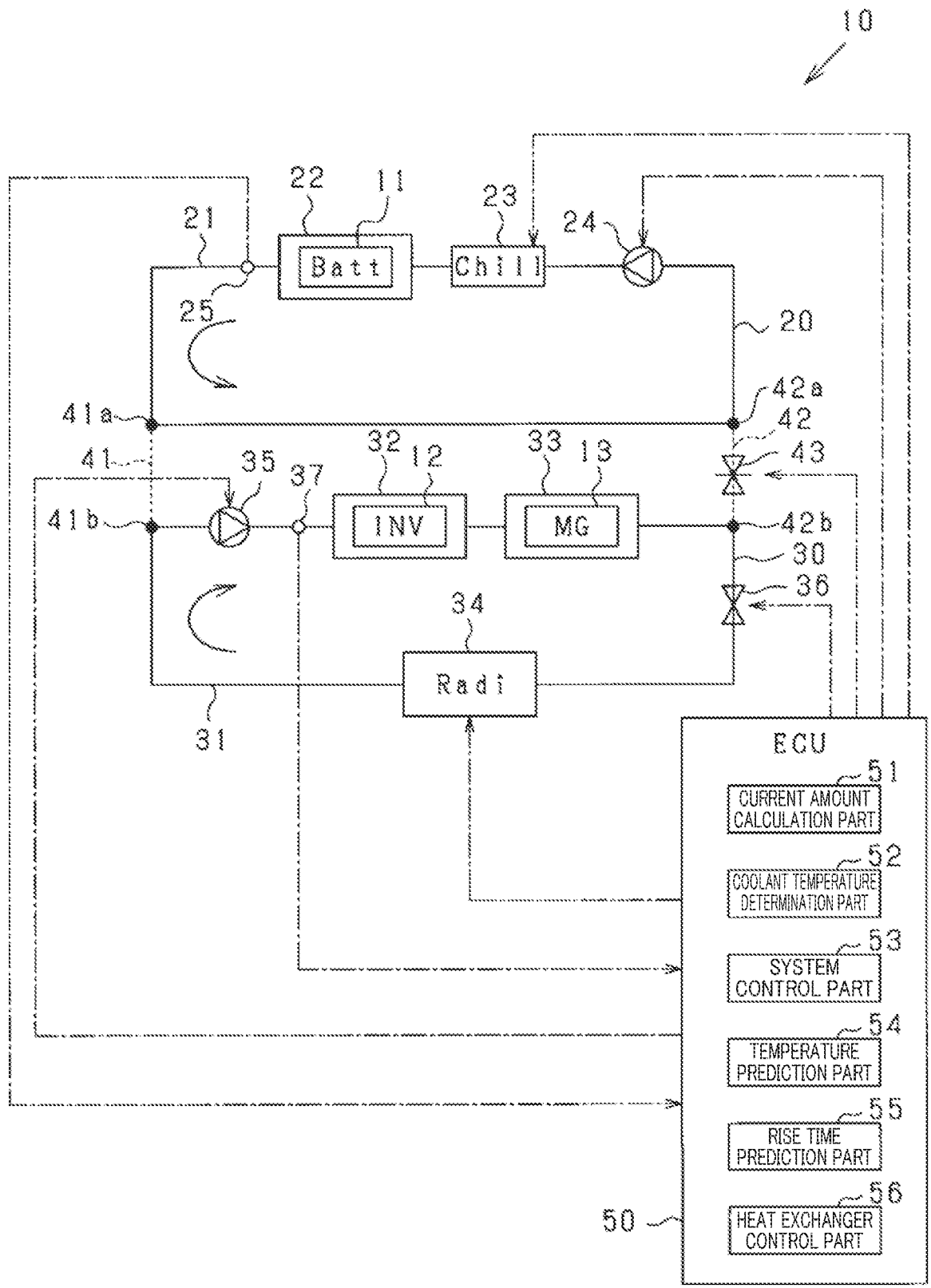
FIG. 1 is an overall view schematically showing a cooling system.

DETAILED DESCRIPTION OF THE
PREFERRED EMBODIMENTS

The maximum value of the output current of an inverter or the like included in an electric drive unit depends on the capacity of the cooling circuit, that is, the coolant temperature. Therefore, in order to improve the maximum value of the output current, the size of the cooling circuit of the electric drive unit needs to be increased to increase the cooling capacity.

However, the period during which an increased maximum value of the output current is desired is temporary. Increasing the size of the cooling circuit in order to obtain such a temporarily required cooling capacity is disproportionate in terms of the cost and housing space.

The present disclosure has been made in view of the above circumstances, and its main purpose is to provide a cooling control device, a cooling system, a program, and a control method capable of downsizing the cooling system.

An aspect of the present disclosure provides a cooling control device configured to control a cooling system having a first cooling circuit that cools a cooling target and a second cooling circuit that cools an electric drive unit. The cooling control device includes a first coolant passage provided in the first cooling circuit configured to circulate a coolant between a first cooling part configured to cool the cooling target and a first heat exchanger, a second coolant passage provided in the second cooling circuit configured to circulate a coolant between an electric drive unit cooling part configured to cool the electric drive unit and a second heat exchanger, the first heat exchanger and the second heat exchanger are each a device that releases heat from the coolant, and the first heat exchanger is configured to lower a temperature of the coolant so that the temperature of the coolant after releasing heat is lower than a temperature of the coolant whose heat has been released by the second heat exchanger, a connection path configured to connect the first coolant passage and the second coolant passage is provided between the first coolant passage and the second coolant passage, and a path control device configured to control a coolant flow in the connection path. The cooling control device further includes a current amount calculation part configured to calculate a required amount of current of the electric drive unit; a coolant temperature determination part configured to determine a necessary coolant temperature, which is a temperature of the coolant to flow in the second coolant passage, according to the required amount of current calculated by the current amount calculation part; and a system control part configured to acquire a temperature of the coolant in the second coolant passage after being supplied from the second heat exchanger and before being supplied to the electric drive unit cooling part as a second coolant temperature, and, when the second coolant temperature is higher than the determined necessary coolant temperature, controls the path control device so that the coolant flows from the first coolant passage to the second coolant passage via the connection path.

The temperature of the coolant used to cool the cooling target is lower than the temperature of the coolant used to cool the electric drive unit. Further, the period during which the maximum value of the amount of current of the electric drive unit is desired to be increased is often temporary, such as when the vehicle starts traveling or when the vehicle starts on a slope.

In view of this, when the second coolant temperature is higher than the necessary coolant temperature, the path control device is controlled so that the coolant flows from the first coolant passage to the second coolant passage via the connection path. As a result, it is possible to cool the electric drive unit and improve the maximum value of the amount of current using the coolant in the first cooling circuit without increasing the size of the second heat exchanger. This means that the cooling system can be downsized.

Another aspect of the present disclosure provides a cooling control device configured to control a cooling system having a first cooling circuit that cools a cooling target and a second cooling circuit that cools an electric drive unit. The cooling control device includes a first coolant passage provided in the first cooling circuit configured to circulate a coolant between a first cooling part configured to cool the cooling target and a first heat exchanger, a second coolant passage provided in the second cooling circuit configured to circulate a coolant between an electric drive unit cooling part configured to cool the electric drive unit and a second heat exchanger, the first heat exchanger and the second heat exchanger are each a device that releases heat from the coolant, and the first heat exchanger is configured to lower a temperature of the coolant so that the temperature of the coolant after releasing heat is lower than a temperature of the coolant whose heat has been released by the second heat exchanger, and a heat transfer device configured to transfer a temperature of the coolant in the first coolant passage to a temperature of the coolant in the second coolant passage is provided between the first coolant passage and the second coolant passage. The cooling control device further includes a current amount calculation part configured to calculate a required amount of current of the electric drive unit; a coolant temperature determination part configured to determine a necessary coolant temperature, which is a temperature of the coolant to flow in the second coolant passage, according to the required amount of current calculated by the current amount calculation part; and a system control part configured to acquire a temperature of the coolant in the second coolant passage after being supplied from the second heat exchanger and before being supplied to the electric drive unit cooling part as a second coolant temperature, and, when the second coolant temperature is higher than the determined necessary coolant temperature, controls the heat transfer device so as to transfer the temperature of the coolant in the first coolant passage to the temperature of the coolant in the second coolant passage.

The temperature of the coolant used to cool the cooling target is lower than the temperature of the coolant used to cool the electric drive unit. Further, the period during which the maximum value of the amount of current of the electric drive unit is desired to be increased is often temporary, such as when the vehicle starts traveling or when the vehicle starts on a slope.

In view of this, when the second coolant temperature is higher than the necessary coolant temperature, the heat transfer device is controlled so as to transfer the temperature of the coolant in the first coolant passage to the temperature of the coolant in the second coolant passage. As a result, it is possible to cool the electric drive unit and improve the maximum value of the amount of current using the temperature of the coolant in the first cooling circuit without increasing the size of the second heat exchanger. This means that the cooling system can be downsized.

Further, since only heat is transferred by the heat transfer device, there is no need to cause the coolant in the first coolant passage to flow into the second coolant passage to mix it with the coolant in the second coolant passage. Therefore, each of the first cooling circuit and the second cooling circuit can be implemented in a closed circuit. The heat transfer from the first coolant passage to the second coolant passage can be completed more quickly than in the case of mixing the coolants.

Yet another aspect of the present disclosure provides a cooling system including a first cooling circuit having a first cooling part configured to cool a cooling target, a first heat exchanger, and a first coolant passage in which a coolant circulates between the first cooling part and the first heat exchanger; a second cooling circuit having an electric drive unit cooling part configured to cool an electric drive unit, a second heat exchanger, and a second coolant passage in which a coolant circulates between the electric drive unit cooling part and the second heat exchanger; a connection path configured to connect the first coolant passage and the second coolant passage; a path control device configured to control a coolant flow through the connection path; and a cooling control device configured to control the path control device, wherein the first heat exchanger and the second heat exchanger are each a device that releases heat from the coolant, and the first heat exchanger is configured to lower a temperature of the coolant so that the temperature of the coolant after releasing heat is lower than a temperature of the coolant whose heat has been released by the second heat exchanger, and the cooling control device includes a current amount calculation part configured to calculate a required amount of current of the electric drive unit, a coolant temperature determination part configured to determine a necessary coolant temperature, which is a temperature of the coolant to flow in the second coolant passage, according to the required amount of current calculated by the current amount calculation part, and a system control part configured to acquire a temperature of the coolant in the second coolant passage after being supplied from the second heat exchanger and before being supplied to the electric drive unit cooling part as a second coolant temperature, and, when the second coolant temperature is higher than the determined necessary coolant temperature, controls the path control device so that the coolant flows from the first coolant passage to the second coolant passage.

As a result, it is possible to cool the electric drive unit and improve the maximum value of the amount of current using the coolant in the first cooling circuit without increasing the size of the second heat exchanger. This means that the cooling system can be downsized.

Yet another aspect of the present disclosure provides a program executed by a cooling control device configured to control a cooling system having a first cooling circuit that cools a cooling target and a second cooling circuit that cools an electric drive unit. The cooling control device includes a first coolant passage provided in the first cooling circuit configured to circulate a coolant between a first cooling part configured to cool the cooling target and a first heat exchanger, a second coolant passage provided in the second cooling circuit configured to circulate a coolant between an electric drive unit cooling part configured to cool the electric drive unit and a second heat exchanger, the first heat exchanger and the second heat exchanger are each a device that releases heat from the coolant, and the first heat exchanger is configured to lower a temperature of the coolant so that the temperature of the coolant after releasing heat is lower than a temperature of the coolant whose heat has been released by the second heat exchanger, a connection path configured to connect the first coolant passage and the second coolant passage is provided between the first coolant passage and the second coolant passage, and a path control device configured to control a coolant flow through the connection path. The program includes a current amount calculation step for calculating a required amount of current of the electric drive; a coolant temperature determination step for determining a necessary coolant temperature, which is a temperature of the coolant to flow in the second coolant passage, according to the required amount of current calculated in the current amount calculation step; and a system control step for acquiring a temperature of the coolant in the second coolant passage after being supplied from the second heat exchanger and before being supplied to the electric drive unit cooling part as a second coolant temperature, and, when the second coolant temperature is higher than the determined necessary coolant temperature, controlling the path control device so that the coolant flows from the first coolant passage to the second coolant passage.

As a result, it is possible to cool the electric drive unit and improve the maximum value of the amount of current using the coolant in the first cooling circuit without increasing the size of the second heat exchanger. This means that the cooling system can be downsized.

Yet another aspect of the present disclosure provides a control method performed by a cooling control device configured to control a cooling system having a first cooling circuit that cools a cooling target and a second cooling circuit that cools an electric drive unit. The cooling control device includes a first coolant passage provided in the first cooling circuit configured to circulate a coolant between a first cooling part configured to cool the cooling target and a first heat exchanger, a second coolant passage provided in the second cooling circuit configured to circulate a coolant between an electric drive unit cooling part configured to cool the electric drive unit and a second heat exchanger, the first heat exchanger and the second heat exchanger are each a device that releases heat from the coolant, and the first heat exchanger is configured to lower a temperature of the coolant so that the temperature of the coolant after releasing heat is lower than a temperature of the coolant whose heat has been released by the second heat exchanger, a connection path configured to connect the first coolant passage and the second coolant passage is provided between the first coolant passage and the second coolant passage, and a path control device configured to control a coolant flow in the connection path. The method includes a current amount calculation step for calculating a required amount of current of the electric drive; a coolant temperature determination step for determining a necessary coolant temperature, which is a temperature of the coolant to flow in the second coolant passage, according to the required amount of current calculated in the current amount calculation step; and a system control step for acquiring a temperature of the coolant in the second coolant passage after being supplied from the second heat exchanger and before being supplied to the electric drive unit cooling part as a second coolant temperature, and, when the second coolant temperature is higher than the determined necessary coolant temperature, controlling the path control device so that the coolant flows from the first coolant passage to the second coolant passage.

As a result, it is possible to cool the electric drive unit and improve the maximum value of the amount of current using the coolant in the first cooling circuit without increasing the size of the second heat exchanger. This means that the cooling system can be downsized.

First Embodiment

An embodiment of a cooling control device, cooling system, program, and control method according to the present disclosure will be described below with reference to the drawings. The cooling control device, cooling system, program, and control method according to the present disclosure are applied to a vehicle (for example, an electric vehicle or hybrid vehicle) in this embodiment. In the following embodiments, parts of an embodiment that are the same as or equivalent to parts of another embodiment are assigned with the same reference numerals.

As shown in FIG. 1, the cooling system 10 includes a first cooling circuit 20 for cooling a rechargeable storage battery 11, a second cooling circuit 30 for cooling an inverter 12 and a motor 13, and an ECU 50 as a cooling control device for controlling the cooling system 10. The storage battery 11 is the cooling target of the first cooling circuit 20.

The inverter 12 is a power conversion circuit that converts a direct current supplied from the storage battery 11 into an alternating current and supplies the alternating current to the motor 13, or converts an alternating current supplied from the motor 13 into a direct current to charge the storage battery 11.

The motor 13 is a rotary electric machine that functions as an electric motor and a generator, and is, for example, a synchronous three-phase AC motor using a permanent magnet. The rotating shaft of the motor 13 is mechanically connected to the axle. When the motor 13 functions as an electric motor, it applies motor torque to rotate the rotating shaft and the axle connected to the rotating shaft and cause the drive wheels fixed to the axle to exert rotational drive force. On the other hand, when the motor 13 functions as a generator when the vehicle is decelerating, the motor 13 performs regenerative braking that suppresses the rotation of the drive wheels. The motor 13 converts the kinetic energy of the drive wheels into electric power and outputs it. This electric power is used to charge the storage battery 11 via the inverter 12. That is, the motor 13 regenerates power when the vehicle decelerates. In this embodiment, the inverter 12 and the motor 13 correspond to an electric drive unit.

The first cooling circuit 20 includes a first coolant passage 21 formed so that cooling water as a coolant circulates, a storage battery cooling part 22 for cooling the storage battery 11, a chiller 23 as a first heat exchanger, and a first pump 24 that generates a flow of cooling water.

The storage battery cooling part 22, the chiller 23, and the first pump 24 are arranged in series in the first coolant passage 21. The first pump 24 controls the flow of the cooling water (water pressure, direction, and the like) so that the cooling water circulates between the storage battery cooling part 22 and the chiller 23 via the first coolant passage 21. The first pump 24 is controlled based on commands from the ECU 50. Further, the order in which the storage battery cooling part 22, the chiller 23, and the first pump 24 are arranged can be changed as appropriate.

The storage battery cooling part 22 is a device for cooling the storage battery 11, and corresponds to a first cooling part. The storage battery cooling part 22 is configured such that, when the cooling water flows in from the first coolant passage 21, the heat from the storage battery 11 is transferred to the cooling water that has flowed in, and the cooling water to which heat has been transferred flows out (returns) to the first coolant passage 21.

The chiller 23 forms a part of a refrigeration circuit (not shown), and is a heat exchanger that adjusts the temperature of the supplied cooling water by causing a coolant flowing through the refrigeration circuit and the cooling water flowing through the first cooling passage 21 to exchange heat. Specifically, the chiller 23 is configured such that, when the cooling water flows in from the first coolant passage 21, the cooling water that has flowed in is cooled (is caused to release heat), and the cooled cooling water flows out to the first coolant passage 21. The chiller 23 is connected to the ECU 50 and is controlled based on commands from the ECU 50. This chiller 23 maintains the temperature of the cooling water flowing into the storage battery cooling part 22 through the first coolant passage 21 at a predetermined temperature, for example, about 20° C. to 30° C.

The second cooling circuit 30 includes a second coolant passage 31 formed so that cooling water circulates, an inverter cooling part 32 that cools the inverter 12, a motor cooling part 33 that cools the motor 13, a radiator 34 as a second heat exchanger, and a second pump 35 that generates a flow of cooling water. In this embodiment, the inverter cooling part 32 and the motor cooling part 33 correspond to an electric drive unit cooling part.

The inverter cooling part 32, the motor cooling part 33, the radiator 34, and the second pump 35 are arranged in series in the second coolant passage 31. The second pump 35 controls the flow of the cooling water (water pressure, etc.) so that the cooling water circulates, via the second coolant passage 31, in the order of the second pump 35→the inverter cooling part 32→the motor cooling part 33→the radiator 34→the second pump 35→the inverter cooling part 32→ . . . . The second pump 35 is controlled based on commands from the ECU 50. Further, the order in which the inverter cooling part 32, the motor cooling part 33, the radiator 34, and the second pump 35 are arranged can be changed as appropriate. However, in general, it is desirable to control the flow of cooling water so that the temperature of the inverter 12 is lower than that of the motor 13. Therefore, it is desirable to arrange the components so that the cooling water from the radiator 34 flows into the inverter cooling part 32 before the motor cooling part 33.

The inverter cooling part 32 is a device for cooling the inverter 12, and is configured such that, when the cooling water flows in from the second coolant passage 31, the heat from the inverter 12 is transferred to the cooling water that has flowed in (the heat of the inverter 12 is released), and the cooling water heated by the heat transfer flows out (returns) to the second coolant passage 31.

Similarly, the motor cooling part 33 is a device for cooling the motor 13, and is configured such that, when the cooling water flows in from the second coolant passage 31, the heat from the motor 13 is transferred to the cooling water that has flowed in, and the cooling water to which heat has been transferred flows out (returns) to the second coolant passage 31.

The radiator 34 is a heat exchanger that causes the cooling water flowing through the second coolant passage 31 to exchange heat with the outside air. Specifically, the radiator 34 is configured such that, when the cooling water flows in from the second coolant passage 31, the cooling water that has flowed in is cooled by releasing its heat to the outside air, and the cooled cooling water flows out (returns) to the second coolant passage 31. The radiator 34 is controlled based on commands from the ECU 50. This radiator 34 maintains the temperature of the cooling water supplied to the inverter cooling part 32 through the second coolant passage 31 at a predetermined temperature, for example, about 60° C.

Therefore, the chiller 23 and the radiator 34 are each a device for releasing the heat of the cooling water. The chiller 23 is configured to cool the cooling water so that the temperature of the cooling water after releasing heat is lower than the temperature of the cooling water whose heat has been released by the radiator 34.

In the second coolant passage 31, a second valve 36 is placed between the motor cooling part 33 and the radiator 34. The second valve 36 controls, for example, the flow rate of the cooling water flowing from the motor cooling part 33 to the radiator 34 in the second coolant passage 31. The second valve 36 is connected to the ECU 50 and is controlled based on commands from the ECU 50. The second valve 36 is normally open.

The first cooling circuit 20 and the second cooling circuit 30 are connected by a first connection path 41 and a second connection path 42. The first connection path 41 is provided so as to connect a first connection point 41a between the outlet of the storage battery cooling part 22 and the inlet of the first pump 24 in the first coolant passage 21, and a second connection point 41b between the outlet of the radiator 34 and the inlet of the second pump 35 in the second coolant passage 31.

The second connection path 42 is provided so as to connect a third connection point 42a between the first connection point 41a and the inlet of the first pump 24 in the first coolant passage 21, and a fourth connection point 42b between the outlet of the motor cooling part 33 and the inlet of the second valve 36 in the second coolant passage 31.

Further, the second connection path 42 is provided with a first valve 43 that controls, for example, the flow rate of the cooling water flowing through the second connection path 42. The first valve 43 is connected to the ECU 50 and is controlled based on commands from the ECU 50.

Next, the ECU 50 will be described. The ECU 50 is an electronic control device having a well-known microcomputer including a CPU, ROM, RAM, flash memory, and the like. This ECU 50 is configured to be capable of obtaining various information. The ECU 50 also has various functions such as a function as a current amount calculation part 51, a function as a coolant temperature determination part 52, a function as a system control part 53, a function as a temperature prediction part 54, a function as a rise time prediction part 55, and a function as a heat exchanger control part 56. The ECU 50 executes these various functions based on the acquired various information. These various functions are realized by executing a program stored in a storage device (storage memory) included in the ECU 50. This program corresponds to the program according to the present disclosure. The various functions may be realized by an electronic circuit which is hardware, or at least part of them may be realized by software, that is, processing executed on a computer.

Next, the various functions of the ECU 50 will be described.

The current amount calculation part 51 calculates the required amount of current of the inverter 12. The required amount of current is the amount of current required for the motor 13 to output a desired torque. That is, since the output torque of the motor 13 is proportional to the amount of current supplied from the inverter 12, when the output torque of the motor 13 needs to be increased, the required amount of current also increases in proportion to it. Therefore, the current amount calculation part 51 calculates the required amount of current of the inverter 12 according to the required output torque of the motor 13.

The current amount calculation part 51 of this embodiment is configured to predict and calculate the required amount of current of the inverter 12 based on the situation the vehicle is in. In this embodiment, the situation the vehicle is in refers to the driving state of the vehicle identified based on vehicle information such as the rotation speed of the motor 13, the operation amount of the accelerator, the operation amount of the brake, the position of the shift lever, and the vehicle body angle. Examples of the driving state of the vehicle are, for example, a driving state in which a stopped vehicle starts, a driving state in which the vehicle starts on a slope, a driving state in which the vehicle climbs a step, and a driving state in which the vehicle suddenly accelerates.

Figure 2B:
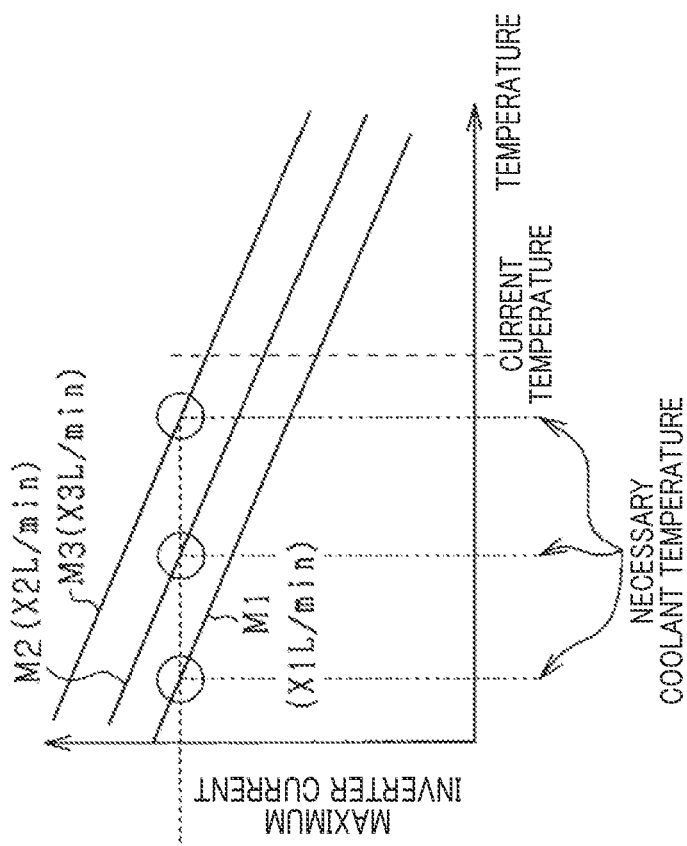
FIG. 2B is a diagram showing a necessary coolant temperature map.
Figure 2A:
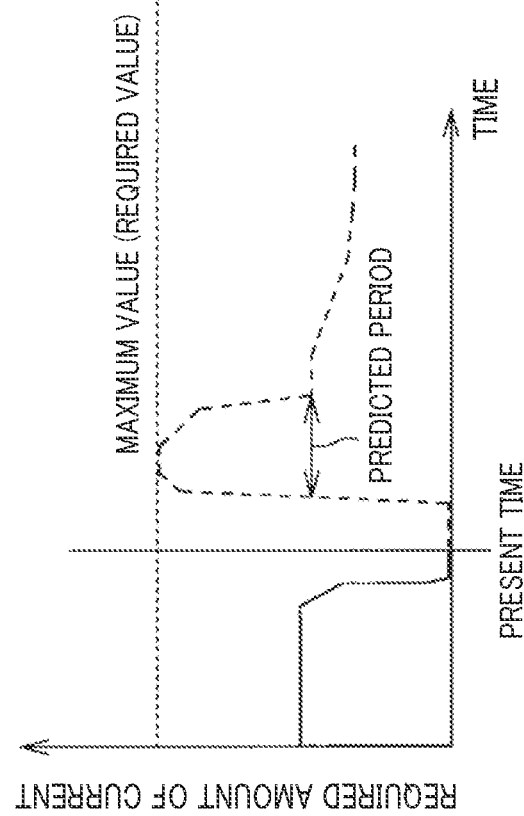
FIG. 2A is a diagram showing an inverter current amount map.

The current amount calculation part 51 identifies the driving state of the vehicle based on the vehicle information, and refers to an inverter current amount map corresponding to the identified driving state. Then, the current amount calculation part 51 predicts and calculates the required amount of current based on that inverter current amount map. The inverter current amount map is, for example, as shown in FIG. 2A, a map showing a prediction of how the required amount of current of the inverter 12 changes with time in the identified driving state. The broken line part in FIG. 2A is an inverter current amount map for when a stopped vehicle starts at full throttle.

The inverter current amount map shows how the required amount of current of the inverter 12 changes during at least a predicted period. The predicted period is the period from the predicted start to the predicted end of the identified driving state, and is a period in which the required amount of current of the inverter 12 is higher than a predetermined threshold value (for example, the amount of current required in a normal state). The current amount calculation part 51 determines the maximum value of the required amount of current in the predicted period by referring to the inverter current amount map. In addition, the current amount calculation part 51 determines the predicted period after which the determined driving state is predicted to be completed.

When the maximum value (required value) of the required amount of current determined by the current amount calculation part 51 is higher than either a motor current limit value or an inverter current limit value, the current amount calculation part 51 overwrites the maximum value of the required amount of current with the smallest (least) one of the motor current limit value and the inverter current limit value.

Here, the motor current limit value is the upper limit value of the amount of current allowed to be input to the motor 13, and is determined using a map or the like based on the temperature of the motor 13 or the like. Similarly, the inverter current limit value is the upper limit value of the amount of current allowed to be output from the inverter 12, and is determined using a map or the like based on the temperature of the inverter 12 or the like. The motor current limit value and the inverter current limit value may be predetermined values.

Next, the coolant temperature determination part 52 will be described. The coolant temperature determination part 52 determines the necessary coolant temperature as the temperature of the cooling water to flow in the second coolant passage 31 according to the required amount of current calculated by the current amount calculation part 51. Specifically, the coolant temperature determination part 52 has a necessary coolant temperature map. As shown in FIG. 2B, this necessary coolant temperature map shows, for each inverter flow rate, a function of the inverter maximum current and the necessary coolant temperature in a graph. In the necessary coolant temperature map of FIG. 2B, the function graphs M1 to M3 exemplify function graphs of the maximum inverter current and the necessary coolant temperature when the inverter flow rates are X1 to X3 (liters per second), respectively.

Here, the inverter flow rate is the flow rate of the cooling water flowing into the inverter cooling part 32 in the second coolant passage 31, and the inverter maximum current is the maximum current that the inverter 12 can output. The necessary coolant temperature is the temperature of the cooling water that should flow into the inverter cooling part 32 in order to allow the inverter 12 to output the corresponding maximum current. That is, the maximum current that can be output by the inverter 12 depends on the temperature of the inverter 12, and generally, the lower the temperature of the inverter 12, the larger the amount of current that can be output.

The coolant temperature determination part 52 determines a combination of an inverter flow rate and a necessary coolant temperature based on the inverter maximum current corresponding to the maximum value of the required amount of current by referring to the necessary coolant temperature map.

The system control part 53 controls the first pump 24 and the first valve 43 so that the cooling water flows from the first coolant passage 21 to the second coolant passage 31 via the first connection path 41 and the second connection path 42. At this time, the system control part 53 controls the second pump 35 and the second valve 36 to adjust the flow rate of the cooling water flowing from the motor cooling part 33 to the radiator 34 in the second coolant passage 31. In the present embodiment, the first connection path 41 and the second connection path 42 correspond to a connection path. Further, the first pump 24 and the first valve 43 correspond to a path control device. The second pump 35 and the second valve 36 correspond to a second coolant control device.

The control process performed by the system control part 53 will be described in detail. The system control part 53 acquires a first coolant temperature which is the temperature of the cooling water flowing through the first coolant passage 21. In this embodiment, the temperature of the cooling water after exiting the storage battery cooling part 22 and before flowing past the first connection point 41a is acquired in the first coolant passage 21. Specifically, a first water temperature sensor 25 is placed near the outlet of the storage battery cooling part 22, and the system control part 53 acquires the first coolant temperature detected by the first water temperature sensor 25. That is, in this embodiment, the first coolant temperature is the temperature near the outlet of the storage battery cooling part 22.

The system control part 53 acquires a second coolant temperature which is the temperature of the cooling water flowing through the second coolant passage 31. In this embodiment, a second water temperature sensor 37 is placed in the second coolant passage 31 at a point after flowing past the second connection point 41b and before being supplied to the inverter cooling part 32. The system control part 53 acquires a second coolant temperature detected by the second water temperature sensor 37. That is, in this embodiment, the second coolant temperature is the temperature near the inlet of the inverter cooling part 32.

When the second coolant temperature is higher than the determined necessary coolant temperature, the system control part 53 controls the first pump 24 and the first valve 43 so that the cooling water flows from the first coolant passage 21 to the second coolant passage 31 via the first connection path 41. The determined necessary coolant temperature is the necessary coolant temperature corresponding to the inverter flow rate when the first coolant flow rate is zero. Note that the first coolant flow rate is the flow rate of the cooling water flowing from the first coolant passage 21 into the second coolant passage 31.

At this time, the system control part 53 adjusts the first coolant flow rate based on a comparison between the necessary coolant temperature and the second coolant temperature, and controls the first pump 24 and the first valve 43 based on the first coolant flow rate. That is, the system control part 53 normally controls the first pump 24 and the first valve 43 so that the larger the difference between the necessary coolant temperature and the second coolant temperature, the higher (larger) the first coolant flow rate.

The system control part 53 also adjusts the second coolant flow rate from the motor cooling part 33 to the radiator 34 according to the first coolant flow rate, and controls the second pump 35 and the second valve 36 based on the second coolant flow rate. For example, the system control part 53 controls the second pump 35 and the second valve 36 so that the higher (larger) the first coolant flow rate, the less (smaller) the second coolant flow rate.

The method of adjusting the first coolant flow rate and the second coolant flow rate will be described in more detail. The system control part 53 has a flow rate map that shows a function of the flow rate of the cooling water at each location in a graph. In the flow rate map shown in FIG. 3A, a function graph F1 of the inverter flow rate and the first coolant flow rate and a function graph F2 of the second coolant flow rate and the first coolant flow rate are shown. In the flow rate map shown in FIG. 3A, as indicated by the function graph F1, the inverter flow rate increases in proportion to the first coolant flow rate.

Figure 3A:
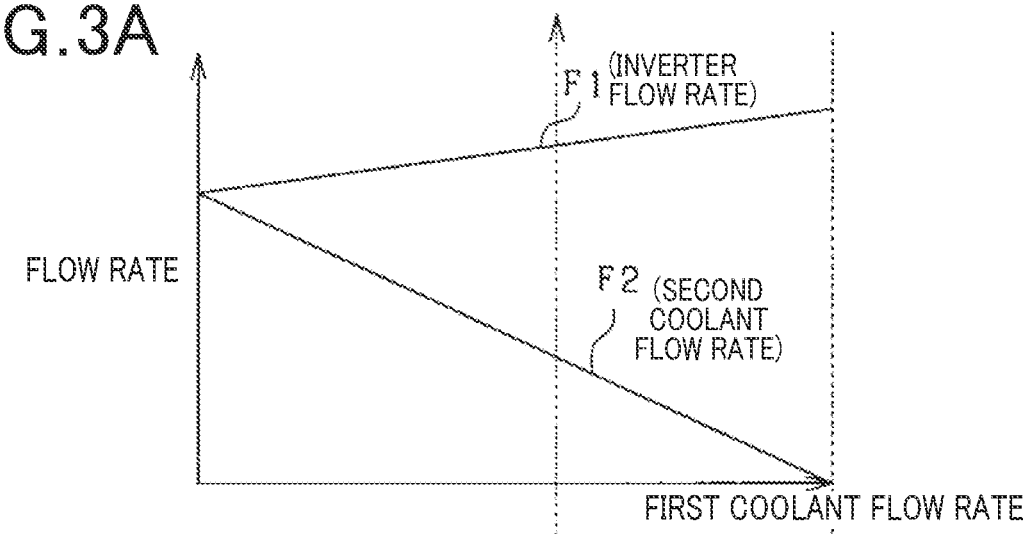
FIG. 3A is a diagram showing a flow rate map.

In the flow rate map shown in FIG. 3A, as indicated by the function graph F2, the second coolant flow rate decreases in inverse proportion to the first coolant flow rate. The flow rate map may be acquired by calculation based on a pressure drop map of each part, an output map of each pump, a valve pressure drop map, and parameters such as the temperature at each part and the valve position, or may be acquired by conducting an experiment or the like.

The system control part 53 also has a cooling water temperature map showing the function of the temperature of the cooling water and the first coolant flow rate at each part in a graph. The cooling water temperature map shown in FIG. 3B shows a function graph T11 of the first coolant flow rate and the first coolant temperature, a function graph T12 of the first coolant flow rate and the radiator outlet temperature, and a function graph T13 of the first coolant flow rate and the second coolant temperature.

Figure 3B:
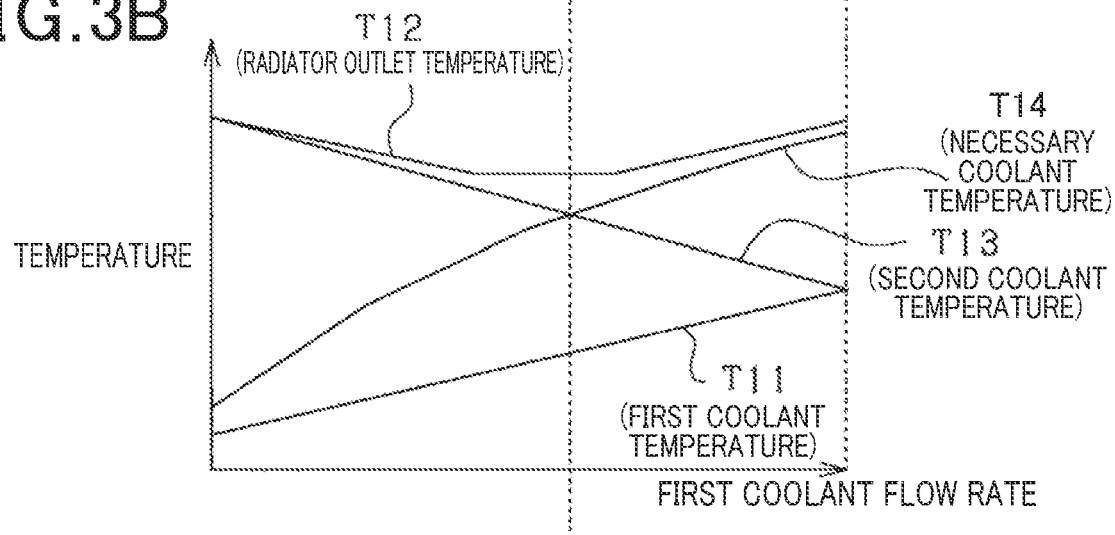
FIG. 3B is a diagram showing a cooling water temperature map.

In the cooling water temperature map shown in FIG. 3B, as indicated by the function graph T11, the first coolant temperature (that is, the temperature of the cooling water flowing out from the storage battery cooling part 22) increases in proportion to the first coolant flow rate. In other words, it can be seen that the larger the amount of cooling water flowing from the first coolant passage 21 into the second coolant passage 31, or the smaller the second coolant flow rate, the higher the first coolant temperature.

In the cooling water temperature map shown in FIG. 3B, the radiator outlet temperature refers to the temperature of the cooling water between the outlet of the radiator 34 and the second connection point 41b (that is, before the cooling water flowing in from the first coolant passage 21 joins). In the cooling water temperature map shown in FIG. 3B, as indicated by the function graph T12, the radiator outlet temperature decreases in inverse proportion to the first coolant flow rate until the first coolant flow rate reaches a predetermined rate, and increases in proportion to the first coolant flow rate when the first coolant flow rate is equal to or larger than the predetermined rate.

In the cooling water temperature map shown in FIG. 3B, as indicated by the function graph T13, the second coolant temperature (that is, the temperature of the cooling water flowing into the inverter cooling part 32) decreases in inverse proportion to the first coolant flow rate. In other words, it can be seen that the larger the amount of cooling water flowing from the first coolant passage 21 into the second coolant passage 31, the lower the second coolant temperature. Note that, when the first coolant flow rate is zero, all the cooling water from the radiator 34 flows into the inverter cooling part 32, and therefore the second coolant temperature is substantially the same as the radiator outlet temperature.

This cooling water temperature map is prepared for each combination of the first coolant temperature and the second coolant temperature when the first coolant flow rate is zero. Alternatively, a cooling water temperature map at a predetermined first coolant temperature and a predetermined second coolant temperature may be prepared and used. Further, a cooling water temperature map at a predetermined first coolant temperature and a predetermined second coolant temperature may be corrected according to a combination of the first coolant temperature and the second coolant temperature acquired when the first coolant flow rate is zero, and the corrected map may be used.

Then, the system control part 53 converts the combination of the inverter flow rate and the necessary coolant temperature determined by the coolant temperature determination part 52 into a combination of the first coolant flow rate and the necessary coolant temperature by referring to the flow rate map. The system control part 53 determines the function graph T14 of the necessary coolant temperature and the first coolant flow rate from this combination of the first coolant flow rate and the necessary coolant temperature.

Then, the system control part 53 applies the determined function graph T14 of the necessary coolant temperature and the first coolant flow rate to the cooling water temperature map. In the cooling water temperature map shown in FIG. 3B, as indicated by the function graph T14, the necessary coolant temperature increases substantially in proportion to the first coolant flow rate. That is, it can be seen that the higher the inverter flow rate, the higher the necessary coolant temperature may be.

Then, in the cooling water temperature map, the system control part 53 finds the intersection between the determined function graph T14 of the necessary coolant temperature and the first coolant flow rate, and the function graph T13 of the first coolant flow rate and the second coolant temperature. That is, the system control part 53 determines the first coolant flow rate at which the necessary coolant temperature and the second coolant temperature are the same.

After that, the system control part 53 determines the second coolant flow rate corresponding to the determined first coolant flow rate by referring to the flow rate map. As described above, based on the necessary coolant temperature, the first coolant temperature, and the second coolant temperature, the system control part 53 adjusts (calculates) the first coolant flow rate and adjusts (calculates) the second coolant flow rate from the motor cooling part 33 to the radiator 34.

Then, the system control part 53 controls the first pump 24 and the first valve 43 based on the determined first coolant flow rate, and controls the second pump 35 and the second valve 36 based on the determined second coolant flow rate.

Note that the system control part 53 determines whether the chiller outlet temperature determined by the temperature prediction part 54 described later is equal to or lower than an allowable coolant temperature determined by the temperature prediction part 54. If the answer is NO, the entry of cooling water is prohibited. That is, the first coolant flow rate is set to zero.

Further, the system control part 53 acquires, from the rise time prediction part 55, the rise time until the temperature of the storage battery 11 reaches the allowable battery temperature value. Then, based on this rise time, the system control part 53 determines whether the predicted period from the start to the completion of the driving state ends by the time the temperature of the storage battery 11 reaches the allowable battery temperature value. If the answer is NO, the system control part 53 prohibits the cooling water from flowing into the second coolant passage 31 from the first coolant passage 21. That is, the first coolant flow rate is set to zero.

Next, the temperature prediction part 54 will be described. The temperature prediction part 54 has a battery temperature map shown in FIG. 4. The battery temperature map shown in FIG. 4 shows a function graph T21 of the first coolant flow rate and the motor outlet temperature, a function graph T22 of the first coolant flow rate and the chiller inlet temperature, and a function graph T23 of the first coolant flow rate and the allowable coolant temperature.

The motor outlet temperature corresponds to the temperature of the cooling water flowing out from the outlet of the motor cooling part 33, and the chiller inlet temperature corresponds to the temperature of the cooling water flowing into the inlet of the chiller 23. The allowable coolant temperature corresponds to a temperature allowed as the temperature of the cooling water flowing into the storage battery cooling part 22. The allowable coolant temperature corresponds to a temperature allowed as the temperature of the cooling water flowing into the storage battery cooling part 22 to make the temperature of the storage battery 11 equal to or lower than a predetermined temperature (allowable battery temperature value).

Figure 4:
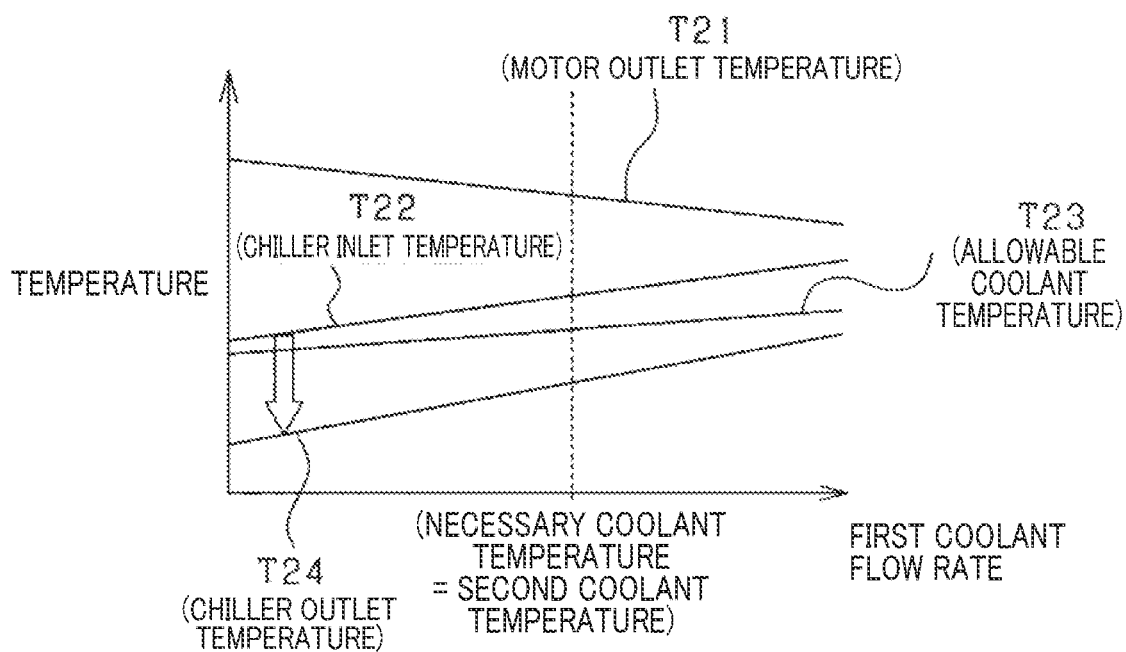
FIG. 4 is a diagram showing a battery temperature map.

In the battery temperature map shown in FIG. 4, as indicated by the function graph T21, the motor outlet temperature decreases in inverse proportion to the first coolant flow rate. In other words, it can be seen that the larger the amount of cooling water flowing from the first coolant passage 21 into the second coolant passage 31, the lower the motor outlet temperature.

In the battery temperature map shown in FIG. 4, as indicated by the function graph T22, the chiller inlet temperature increases in proportion to the first coolant flow rate. In other words, it can be seen that the larger the amount of cooling water flowing from the first coolant passage 21 into the second coolant passage 31, the higher the chiller inlet temperature, and the chiller inlet temperature approaches the motor outlet temperature. In the battery temperature map shown in FIG. 4, as indicated by the function graph T23, the allowable coolant temperature gradually increases in proportion to the first coolant flow rate.

This battery temperature map is prepared for each combination of the motor outlet temperature and the chiller inlet temperature when the first coolant flow rate is zero. Alternatively, an allowable temperature map at a predetermined motor outlet temperature and a predetermined chiller inlet temperature may be prepared, and the allowable temperature map may be corrected according to a combination of the motor outlet temperature and the chiller inlet temperature acquired when the first coolant flow rate is zero.

Then, in the function graph T22, the temperature prediction part 54 subtracts the cooling temperature drop caused by the chiller 23 from the chiller inlet temperature to obtain a function graph T24 of the first coolant flow rate and the chiller outlet temperature (that is, the temperature of cooling water flowing into the storage battery cooling part 22).

Note that the cooling temperature drop caused by the chiller 23 is determined by the temperature prediction part 54. The cooling temperature drop caused by the chiller 23 can be determined from the cooling performance of the chiller 23, and the cooling performance of the chiller 23 is determined by, for example, using a performance map based on, for example, the power supplied to the chiller 23 and the coolant temperature of the refrigeration circuit.

The system control part 53 refers to the function graph T23 in the battery temperature map and determines the allowable coolant temperature corresponding to the first coolant flow rate at which the necessary coolant temperature and the second coolant temperature match. Similarly, the system control part 53 refers to the function graph T24 in the battery temperature map and determines the chiller outlet temperature corresponding to the first coolant flow rate at which the necessary coolant temperature and the second coolant temperature match. This chiller outlet temperature is not the temperature at the present time but a predicted temperature. Then, the system control part 53 determines whether the determined chiller outlet temperature is equal to or lower than the determined allowable coolant temperature. If the answer is NO, the system control part 53 prohibits the cooling water from flowing into the second coolant passage 31 from the first coolant passage 21.

Figure 5A:
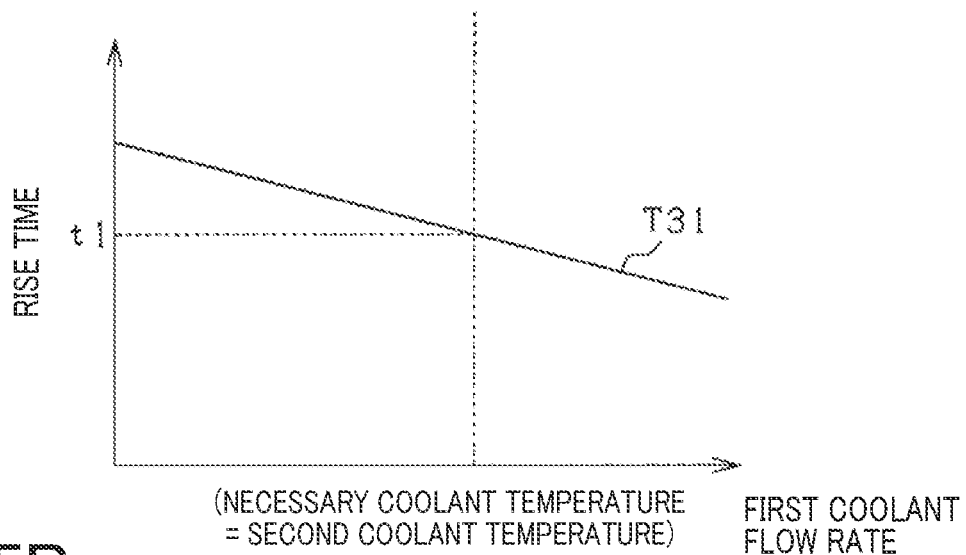
FIG. 5A is a diagram showing a rise time prediction map.

Next, the rise time prediction part 55 will be described. The rise time prediction part 55 has a rise time prediction map. As shown in FIG. 5A, the rise time prediction map shows a function graph T31 of the rise time it takes until the temperature of the storage battery 11 reaches the allowable battery temperature value and the first coolant flow rate. The function graph T31 of the rise time and the first coolant flow rate in the rise time prediction map is determined by the rise time prediction part 55 based on the chiller inlet temperature, the amount of current of the storage battery 11, the body temperature of the storage battery 11, the amount of heat release, the heat capacity, the upper temperature limit, and the like.

Figure 5B:
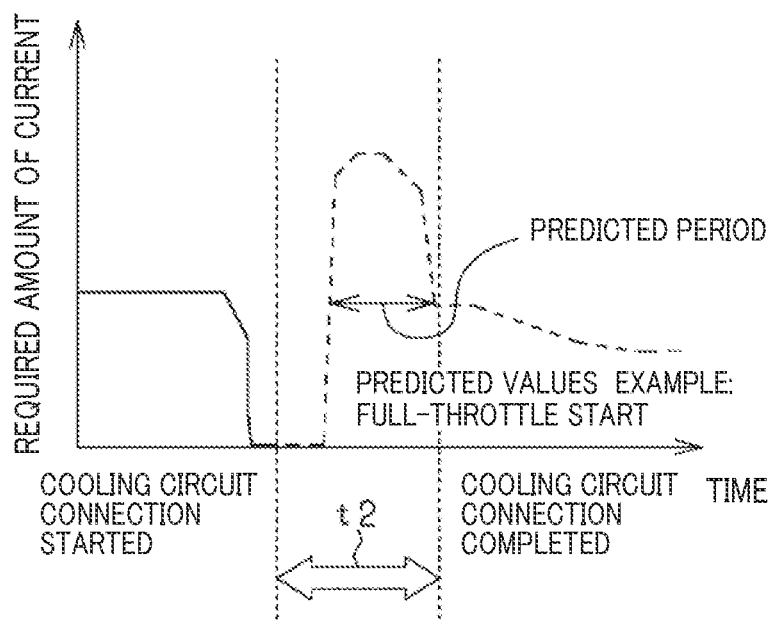
FIG. 5B is a diagram showing an inverter current amount map.

Based on the function graph T31 shown in the rise time prediction map, the rise time prediction part 55 determines the rise time (indicated by t1 in FIG. 5A) corresponding to the first coolant flow rate at which the necessary coolant temperature and the second coolant temperature match. Based on this rise time, the system control part 53 determines whether the predicted period from the start to the completion of the driving state ends by the time the temperature of the storage battery 11 reaches the allowable battery temperature value. That is, it is determined whether the rise time t1 is longer than the time until the end of the predicted period (indicated by t2 in FIG. 5B). If the answer is NO, the system control part 53 prohibits the cooling water from flowing into the second coolant passage 31 from the first coolant passage 21.

Next, the heat exchanger control part 56 will be described. When the chiller outlet temperature is not equal to or lower than the allowable coolant temperature or when the rise time is shorter than the time until the predicted period ends, the heat exchanger control part 56 controls the chiller 23 so as to improve the cooling capacity of the chiller 23.

Figure 6:
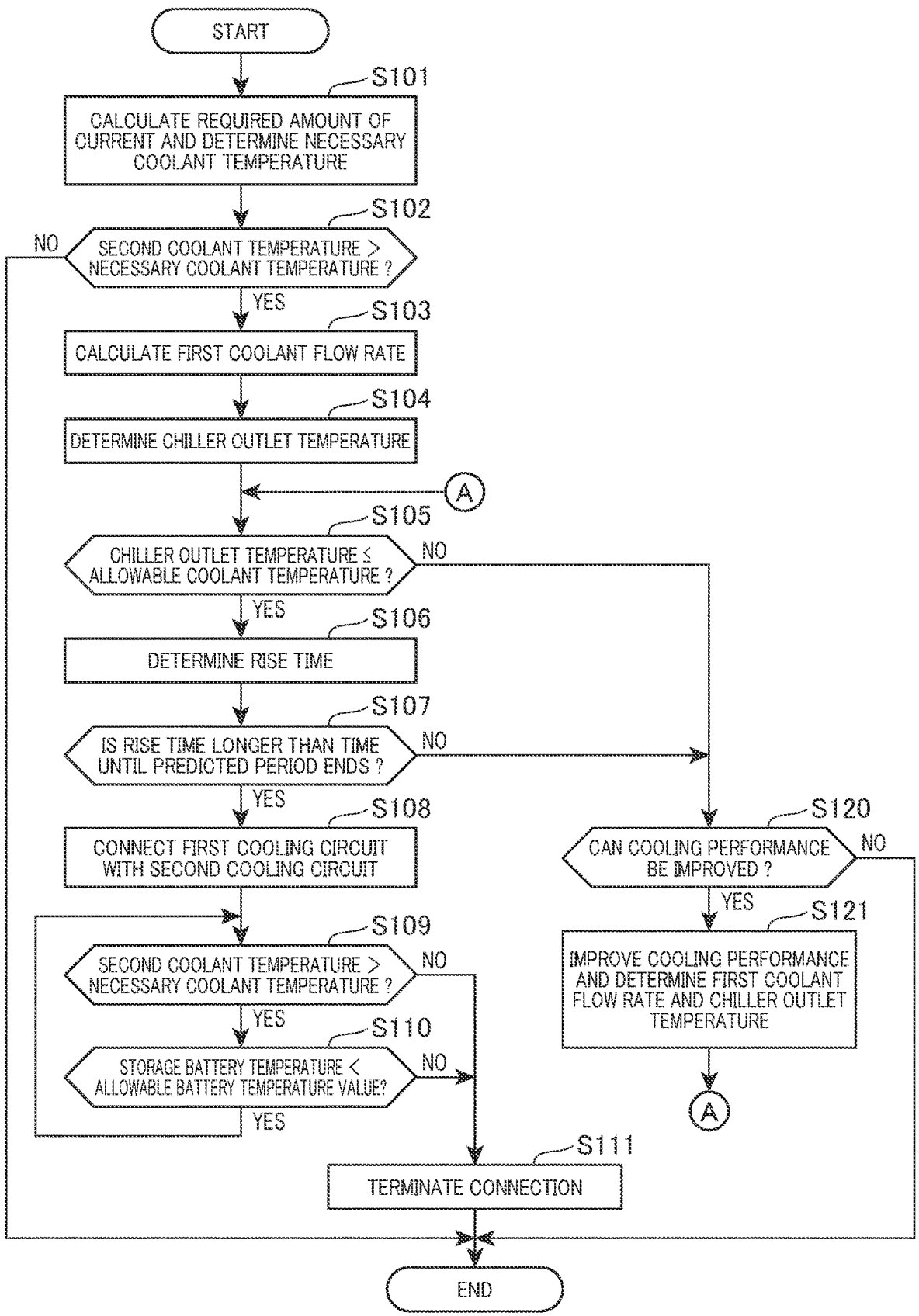
FIG. 6 is a flowchart showing a cooling circuit connection process.

Next, the cooling circuit connection process carried out by the ECU 50 will be described based on FIG. 6. The cooling circuit connection process is carried out by the ECU 50 at predetermined intervals. By executing the cooling circuit connection process, the control method according to the present disclosure will be implemented.

The current amount calculation part 51 as the ECU 50 calculates the required amount of current the inverter 12 as described above (step S101). Further, in step S101, as described above, the ECU 50 as the coolant temperature determination part 52 determines the necessary coolant temperature as the temperature of the cooling water to flow in the second coolant passage 31 according to the calculated required amount of current. That is, in step S101, the ECU 50 determines a combination of an inverter flow rate and a necessary coolant temperature based on the inverter maximum current corresponding to the maximum value of the required amount of current. This step S101 corresponds to a current amount calculation step and a coolant temperature determination step.

Next, the ECU 50 as the system control part 53 determines whether the cooling of the inverter 12 is insufficient to output the required amount of current (step S102). That is, the ECU 50 acquires the second coolant temperature and determines whether the second coolant temperature is higher than the necessary coolant temperature. The necessary coolant temperature with which the second coolant temperature is compared is determined based on the combination of the inverter flow rate and the necessary coolant temperature determined in step S101. Note that this inverter flow rate is the inverter flow rate when the first coolant flow rate is zero, and is determined from the flow rate map.

If the answer is NO in step S102, the ECU 50 ends the cooling circuit connection process. On the other hand, if the answer is YES in step S102, the ECU 50 as the system control part 53 calculates the first coolant flow rate (step S103).

In step S103, as described above, the ECU 50 refers to the flow rate map and converts the combination of the inverter flow rate and the necessary coolant temperature determined in step S101 into a combination of the first coolant flow rate and the necessary coolant temperature, and thereby determines the function graph T14 of the necessary coolant temperature and the first coolant flow rate. Then, the ECU 50 applies the determined function graph T14 of the necessary coolant temperature and the first coolant flow rate to the cooling water temperature map to find the intersection between the function graphs T14 and T13. That is, the ECU 50 calculates the first coolant flow rate at which the necessary coolant temperature and the second coolant temperature match.

As described above, the ECU 50 as the temperature prediction part 54 determines the chiller outlet temperature corresponding to the first coolant flow rate calculated in step S103 (step S104). Then, as described above, the ECU 50 as the temperature prediction part 54 refers to the function graph T23 in the battery temperature map and determines the allowable coolant temperature corresponding to the first coolant flow rate calculated in step S103. The ECU 50 determines whether the chiller outlet temperature determined in step S104 is equal to or lower than that allowable coolant temperature (step S105). That is, it is determined whether the storage battery 11 can be sufficiently cooled even if the first coolant flow rate is adjusted.

If the answer is NO in step S105, the ECU 50 prohibits the cooling water from flowing into the second coolant passage 31 from the first coolant passage 21, and proceeds to step S120 described later.

Subsequently, the ECU 50 as the rise time prediction part 55 determines the rise time corresponding to the first coolant flow rate calculated in step S103 (or step S121) based on the function graph T31 in the rise time prediction map (step S106).

Based on the rise time determined in step S106, the ECU 50 as the system control part 53 determines whether the predicted period from the start to the completion of the driving state ends by the time the temperature of the storage battery 11 reaches the allowable battery temperature value (step S107). Specifically, the ECU 50 determines whether the rise time t1 is longer than the time t2 until the end of the predicted period.

If the answer is NO in step S107, the ECU 50 proceeds to step S120 described later. On the other hand, if the answer is YES in step S107, the ECU 50 as the system control part 53 controls the system so that the first cooling circuit 20 is connected to the second cooling circuit 30 and the cooling water flows into the second coolant passage 31 from the first coolant passage 21 (step S108). That is, the ECU 50 controls the first pump 24 and the first valve 43 based on the determined first coolant flow rate. In addition, in step S108, the ECU 50 determines the second coolant flow rate corresponding to the determined first coolant flow rate by referring to the flow rate map, and controls the second pump 35 and the second valve 36 based on the determined second coolant flow rate. This step S108 corresponds to a system control step.

Then, the ECU 50 as the system control part 53 determines whether the second coolant temperature is higher than the necessary coolant temperature (step S109). The second coolant temperature is the actual temperature of the cooling water acquired from the second water temperature sensor 37. If the answer is YES, the ECU 50 determines whether the temperature of the storage battery 11 is lower than the allowable battery temperature value (step S110). If the answer is YES, after a predetermined time, the ECU 50 proceeds to step S109 again and continues to allow the cooling water to flow from the first coolant passage 21 into the second coolant passage 31.

On the other hand, if the answer is NO in Step S109 or step S110, the ECU 50 terminates the connection between the first cooling circuit 20 and the second cooling circuit 30 (step S111). That is, the ECU 50 controls the first pump 24 and the first valve 43 so that the first coolant flow rate becomes zero. In addition, the ECU 50 determines the second coolant flow rate corresponding to when the first coolant flow rate becomes zero by referring to the flow rate map, and controls the second pump 35 and the second valve 36 based on the determined second coolant flow rate. After that, the ECU 50 ends the cooling circuit connection process.

On the other hand, if the answer is NO in step S105, then the process proceeds to step S120, and the ECU 50 as the heat exchanger control part 56 determines whether the cooling performance of the chiller 23 has room for improvement (step S120). Specifically, the ECU 50 determines whether the power supplied to the chiller 23 is equal to or smaller than a predetermined limit value.

If the answer is NO, the ECU 50 ends the cooling circuit connection process. On the other hand, if the answer is YES in step S120, the ECU 50 improves the cooling performance of the chiller 23 (step S121). Then, after improving the cooling performance of the chiller 23, the ECU 50 determines the first coolant flow rate and the chiller outlet temperature again, and acquires the function graph T24 of the first coolant flow rate and the chiller outlet temperature (step S121). The system control part 53 proceeds to step S105 after that.

According to the above configuration, the present embodiment has the following remarkable effects.

Generally, the temperature of cooling water used to cool the storage battery 11 is, for example, about 20° C. to 30° C., which is lower than the temperature of the cooling water (for example, about 60° C.) used to cool the inverter 12, the motor 13, and the like. Further, the period during which the maximum value of the amount of current of the inverter 12 is desired to be increased is often temporary, such as when the vehicle starts traveling or when the vehicle starts on a slope.

In view of this, when the second coolant temperature is higher than the necessary coolant temperature, the ECU 50 serving as the system control part 53 controls the first pump 24 and the first valve 43 so that the cooling water flows from the first coolant passage 21 to the second coolant passage 31 via the first connection path 41 and the second connection path 42. As a result, it is possible to cool the inverter 12 and improve the maximum value of the amount of current using the low-temperature cooling water in the first cooling circuit 20 without increasing the size of the radiator 34. That is, the cooling system 10 can be downsized.

The ECU 50 serving as the system control part 53 is configured to adjust the first coolant flow rate from the first coolant passage 21 to the second coolant passage 31 based on a comparison between the necessary coolant temperature and the second coolant temperature. To be more specific, the ECU 50 refers to the flow rate map and converts the combination of the inverter flow rate and the necessary coolant temperature determined in step S101 into a combination of the first coolant flow rate and the necessary coolant temperature, and thereby determines the function graph T14 of the necessary coolant temperature and the first coolant flow rate. Then, the ECU 50 applies the determined function graph T14 of the necessary coolant temperature and the first coolant flow rate to the cooling water temperature map to find the intersection between the function graphs T14 and T13. That is, the ECU 50 calculates the first coolant flow rate at which the necessary coolant temperature and the second coolant temperature match.

This makes it possible to quickly bring the second coolant temperature closer to the necessary coolant temperature by adjusting the first coolant flow rate so that the necessary coolant temperature and the second coolant temperature match. In addition, it is possible to prevent the second coolant temperature of from being excessively decreased or the first coolant temperature of from rising excessively.

Even when the system is controlled to allow the cooling water to flow from the first coolant passage 21 to the second coolant passage 31, the second coolant temperature does not immediately reach the necessary coolant temperature. In view of this, the ECU 50 serving as the current amount calculation part 51 predicts and calculates the required amount of current of the inverter 12 based on the situation the vehicle is in. Specifically, the ECU 50 identifies the driving state of the vehicle based on the vehicle information and/or the like, and refers to an inverter current amount map corresponding to the identified driving state. Then, the ECU 50 predicts and calculates the required amount of current in the predicted period from the predicted start to the predicted end of the identified driving state based on that inverter current amount map. The ECU 50 controls the system so that the cooling water flows from the first coolant passage 21 to the second coolant passage 31 based on the required amount of current. This makes it possible to improve the required amount of current of the inverter 12 in a timely manner.

The ECU 50 as the system control part 53 adjusts the first coolant flow rate and the second coolant flow rate based on the necessary coolant temperature, the first coolant temperature, and the second coolant temperature. To be specific, the ECU 50 refers to the cooling water temperature map and determines the function graph T13 of the first coolant flow rate and the second coolant temperature. Since the cooling water temperature map is determined based on the acquired first coolant temperature and second coolant temperature, the function graph T13 is also determined based on the first coolant temperature and second coolant temperature. For example, the initial value of the second coolant temperature, that is, the second coolant temperature when the second coolant flow rate is zero is determined according to the acquired second coolant temperature. When the first coolant temperature is low, in the function graph T13, the rate of decrease in the second coolant temperature is large (the slope is steep), and when the first coolant temperature is high, the rate of decrease in the first coolant temperature is small (the slope is gentle).

The ECU 50 finds the intersection between the function graph T14 of the necessary coolant temperature and the first coolant flow rate, and the function graph T13 of the first coolant flow rate and the second coolant temperature, and adjusts the first coolant flow rate so that the necessary coolant temperature and the second coolant temperature match. Further, based on the flow rate map, the ECU 50 adjusts the second coolant flow rate according to the first coolant flow rate at which the necessary coolant temperature and the second coolant temperature match.

Since the necessary coolant temperature, the first coolant temperature, and the second coolant temperature are taken into consideration, the first coolant flow rate and the second coolant flow rate can be appropriately adjusted. As a result, for example, even when the difference between the second coolant temperature and the necessary coolant temperature is large, the second coolant temperature can be rapidly decreased by increasing the amount of cooling water flowing from the first coolant passage 21 into the inverter cooling part 32.

In addition, for example, when the difference between the second coolant temperature and the necessary coolant temperature is small, the first coolant flow rate is reduced while the second coolant the flow rate is increased. By reducing the amount of cooling water flowing from the first coolant passage 21 into the inverter cooling part 32, the second coolant temperature can be slowly decreased while suppressing the increase in the first coolant temperature. Further, for example, when the first coolant temperature is low and the difference between the first coolant temperature and the second coolant temperature is large, the first coolant flow rate is reduced to suppress the increase in the first coolant temperature. Therefore, it is possible to appropriately manage the temperature of the cooling water while meeting the required amount of current of the inverter 12 in a timely manner.

When the chiller outlet temperature is higher than the allowable coolant temperature as a coolant for cooling the storage battery 11, if the cooling water flows from the first coolant passage 21 to the second coolant passage 31, the problem arises that the storage battery 11 cannot be appropriately cooled. Meanwhile, it is less inconvenient if the output torque of the motor 13 is slightly reduced than not being able to appropriately cool the storage battery 11. In view of this, when the chiller outlet temperature is higher than the allowable coolant temperature, the ECU 50 controls the system so that the cooling water does not flow from the first coolant passage 21 to the second coolant passage 31. This makes it possible to cool the storage battery 11 preferentially.

Once the chiller outlet temperature exceeds the allowable coolant temperature, even if the supply of cooling water from the first coolant passage 21 to the second coolant passage 31 is stopped, it is difficult to immediately make the first coolant temperature equal to or lower than the allowable coolant temperature. Therefore, the ECU 50 serving as the temperature prediction part 54 predicts the chiller outlet temperature in the case the first coolant flow rate is adjusted so that the second coolant temperature reaches the necessary coolant temperature. When the predicted chiller outlet temperature is higher than the allowable coolant temperature, the ECU 50 as the system control part 53 controls the system so that the cooling water does not flow from the first coolant passage 21 to the second coolant passage 31. This makes it possible to cool the storage battery 11 preferentially.

When the predicted chiller outlet temperature is higher than the allowable coolant temperature and the cooling performance of the chiller 23 has room for improvement, the ECU 50 as the heat exchanger control part 56 improves the cooling performance of the chiller 23. After improving the cooling performance, the ECU 50 again determines whether the chiller outlet temperature is equal to or lower than the allowable coolant temperature, and if it is equal to or lower than the allowable coolant temperature, the ECU 50 allows the cooling water to flow from the first coolant passage 21 to the second coolant passage 31. This makes it possible to supply the required amount of current of the inverter 12 as much as possible.

The ECU 50 as the rise time prediction part 55 predicts the rise time until the temperature of the storage battery 11 reaches the allowable battery temperature. Further, the ECU 50 as the current amount calculation part 51 determines the predicted period during which the required amount of current is predicted to be higher than a predetermined threshold value based on the situation the vehicle is in. When the predicted rise time is determined to be shorter than the time until the predicted period ends, the ECU 50 as the system control part 53 controls the system so that the cooling water does not flow from the first coolant passage 21 to the second coolant passage 31. This makes it possible to cool the storage battery 11 preferentially so that the temperature of the storage battery 11 does not exceed the allowable battery temperature.

When the rise time is determined to be shorter than the time until the predicted period ends and the cooling performance of the chiller 23 has room for improvement, the ECU 50 as the heat exchanger control part 56 improves the cooling performance of the chiller 23. After improving the cooling performance, the ECU 50 again determines whether the rise time is longer than the time until the predicted period ends, and if the rise time is determined to be longer than the time until the predicted period ends, the ECU 50 allows the cooling water to flow from the first coolant passage 21 to the second coolant passage 31. This makes it possible to supply the required amount of current of the inverter 12 as much as possible.

Second Embodiment

The configuration of the cooling system 10 of the first embodiment may be changed as follows. Note that parts that are identical or equivalent to the parts of the first embodiment are assigned with the same reference signs in the drawings.

Figure 7:
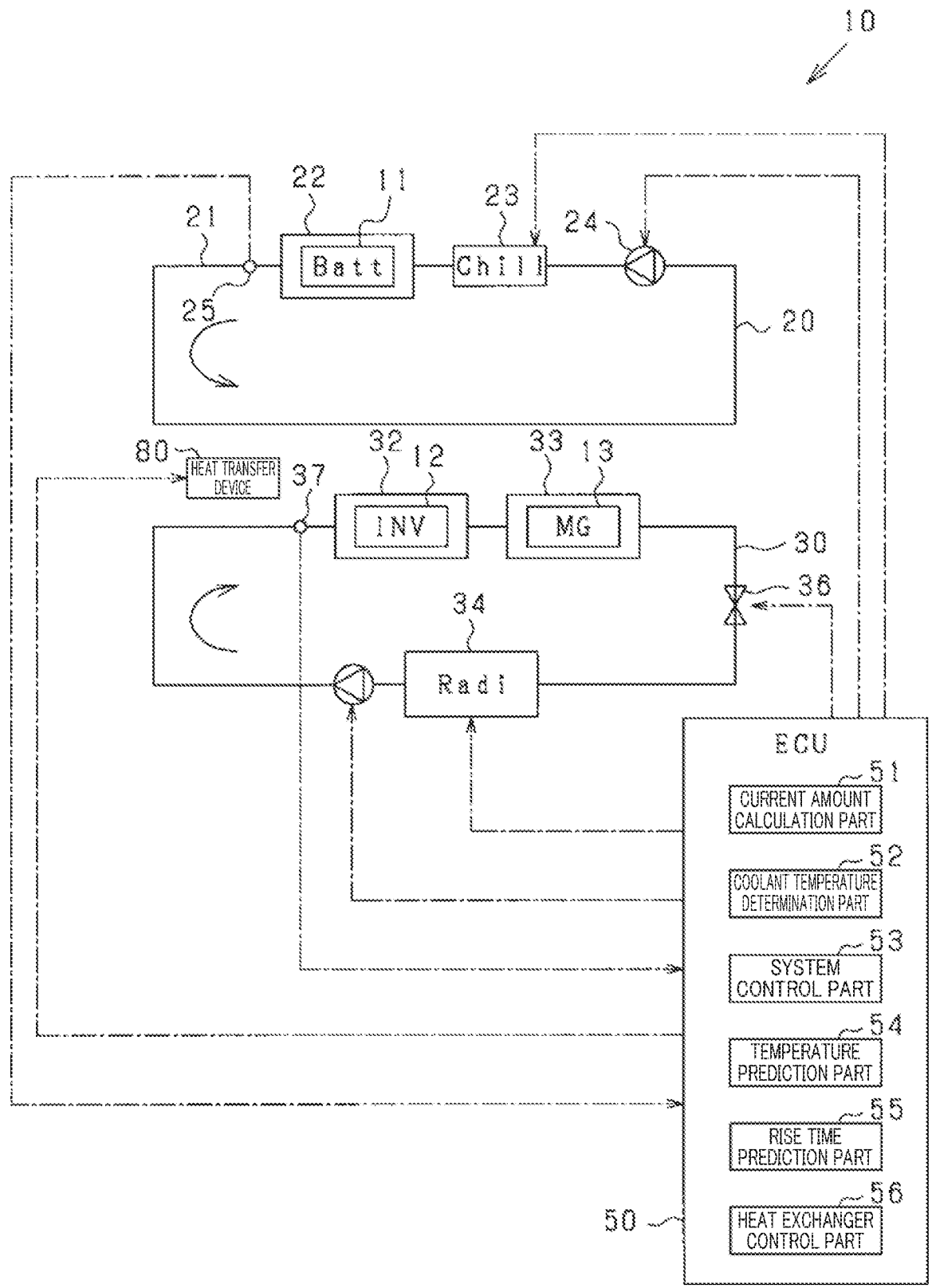
FIG. 7 is an overall view schematically showing a cooling system according to a second embodiment.

As shown in FIG. 7, unlike the first embodiment, the cooling system 10 of the second embodiment is not provided with the first connection path 41 and the second connection path 42. On the other hand, a heat transfer device 80 for transferring the temperature of the cooling water in the first coolant passage 21 to the temperature of the cooling water in the second coolant passage 31 is provided between the first coolant passage 21 and the second coolant passage 31. Note that the heat transfer device 80 is configured to transfer only the heat of the cooling water via the wall surface or the like without mixing the cooling water streams of the cooling circuits.

When the second coolant temperature is higher than the necessary coolant temperature, the ECU 50 as the system control part 53 of the second embodiment is configured to control the heat transfer device 80 so as to transfer the temperature of the cooling water in the first coolant passage 21 to the temperature of the cooling water in the second coolant passage 31.

In the second embodiment, when the second coolant temperature is higher than the necessary coolant temperature, the ECU 50 controls the heat transfer device 80 so as to transfer the temperature of the cooling water in the first coolant passage 21 to the temperature of the cooling water in the second coolant passage 31. As a result, it is possible to cool the inverter 12 and improve the maximum value of the amount of current of the inverter 12 using the temperature of the cooling water in the first cooling circuit 20 without increasing the size of the radiator 34. This means that the cooling system 10 can be downsized.

Further, since only heat is transferred by the heat transfer device 80, there is no need to cause the cooling water in the first coolant passage 21 to flow into the second coolant passage 31 to mix it with the cooling water in the second coolant passage 31. Therefore, each of the first cooling circuit 20 and the second cooling circuit 30 can be implemented in a closed circuit, which makes it possible to use different kinds of coolants. In addition, the heat transfer from the first coolant passage 21 to the second coolant passage 31 can be completed more quickly than in the case of mixing the cooling water.

Third Embodiment

The configuration of the cooling system 10 of the first embodiment may be changed as follows. Note that parts that are the identical or equivalent to the parts of the first embodiment are assigned with the same reference signs in the drawings.

Figure 11:
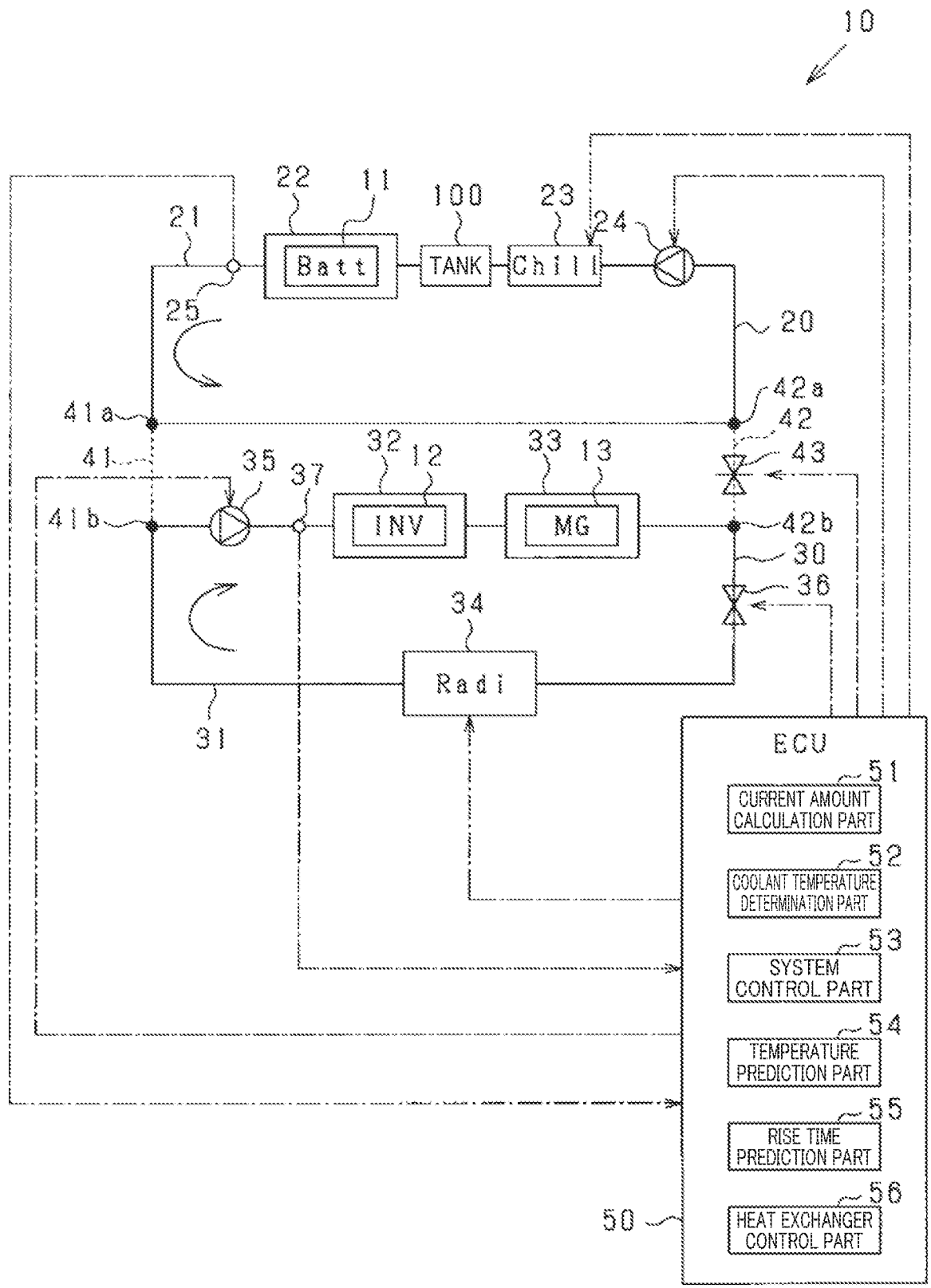
FIG. 11 is an overall view schematically showing a cooling system according to a third embodiment.

As shown in FIG. 11, the first cooling circuit 20 of the third embodiment is provided with a tank 100 as a coolant storage part for storing cooling water. The tank 100 is placed in the first coolant passage 21 before the storage battery cooling part 22 and after the chiller 23. That is, the chiller 23, the tank 100, and the storage battery cooling part 22 are arranged in series in this order. The tank 100 is configured to temporarily store at least a part of the cooling water whose heat has been released by the chiller 23.

Figure 12:
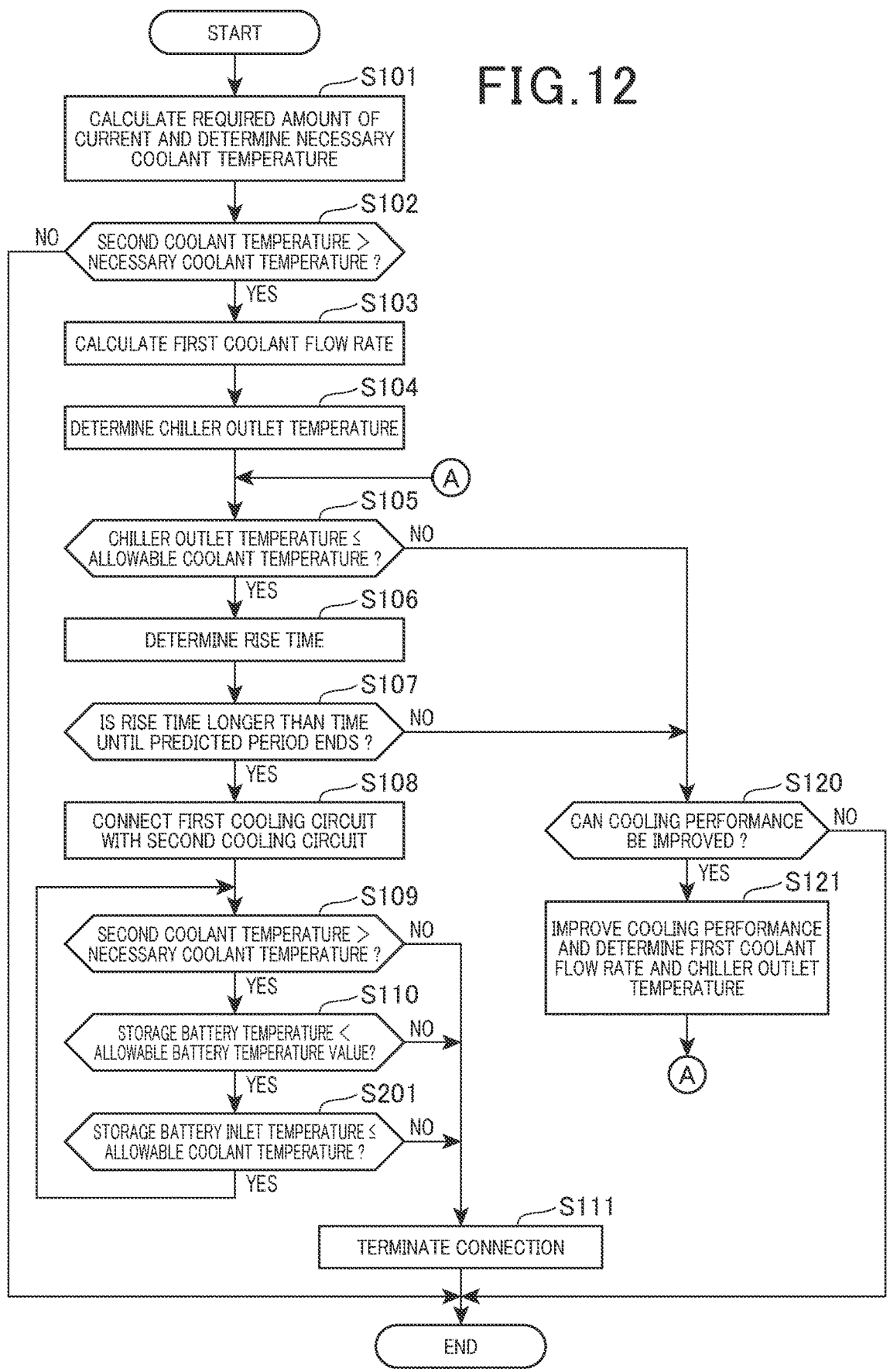
FIG. 12 is a flowchart showing a cooling circuit connection process according to the third embodiment.

Next, the cooling circuit connection process of the third embodiment will be described based on FIG. 12. The procedures from step S101 to step S110 and the procedures of steps S120 and S121 are the same as those in the first embodiment, and therefore will not be described.

If the answer is YES in step S110, the ECU 50 acquires a storage battery inlet temperature, which is the temperature at the inlet of the storage battery cooling part 22, and determines whether the storage battery inlet temperature is equal to lower than the allowable coolant temperature (step S201). The storage battery inlet temperature is the temperature of the cooling water between the tank 100 and the storage battery cooling part 22, and is detected by a water temperature sensor or the like (not shown). If the answer is YES in step S201, after a predetermined time, the ECU 50 proceeds to step S109 again and continues to allow the cooling water to flow from the first coolant passage 21 into the second coolant passage 31.

On the other hand, if the answer is NO in any one of steps S109, S110, and S201, the ECU 50 terminates the connection between the first cooling circuit 20 and the second cooling circuit 30 (step S111). That is, the ECU 50 controls the first pump 24 and the first valve 43 so that the first coolant flow rate becomes zero. In addition, the ECU 50 determines the second coolant flow rate corresponding to when the first coolant flow rate becomes zero by referring to the flow rate map, and controls the second pump 35 and the second valve 36 based on the determined second coolant flow rate. After that, the ECU 50 ends the cooling circuit connection process.

According to the above configuration, the third embodiment has the following remarkable effects in addition to those of the first embodiment.

The first cooling circuit 20 includes the tank 100 for temporarily storing at least a part of the cooling water whose heat has been released by the chiller 23. As a result, even if the amount of cooling water whose heat has been released by the chiller 23 increases and the cooling water flows into the first cooling circuit 20 from the second cooling circuit 30, the temperature rise in the first coolant temperature can be moderated. This makes it possible to increase the rise time until the temperature of the storage battery 11 reaches the allowable battery temperature value, and therefore the answer is more likely to be YES in step S107.

Figure 13:
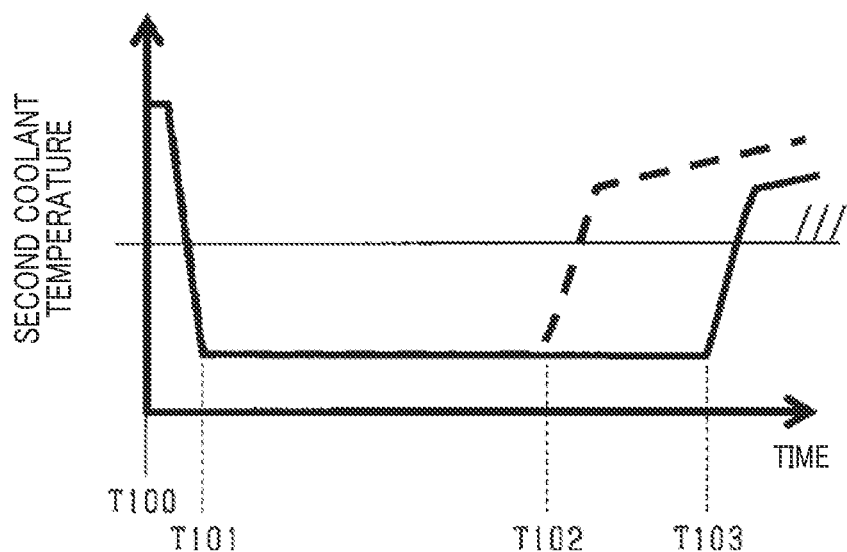
FIG. 13 is a diagram showing how a second coolant temperature changes.

Further, as shown in FIG. 13, it is possible to increase the time for which the second coolant temperature can be maintained at the set temperature (from time point T101 to time point T103) after the connecting the first cooling circuit 20 and the second cooling circuit 30 (time point T100). That is, it is possible to increase the time for which the second coolant temperature can be maintained at a low temperature. The broken line in FIG. 13 indicates how the second coolant temperature changes when the tank 100 is not provided. According to this broken line, it can be seen that when the tank 100 is not provided, the time for which the second coolant temperature can be maintained at the set temperature (from time point T101 to time point T102) decreases.

Figure 14:
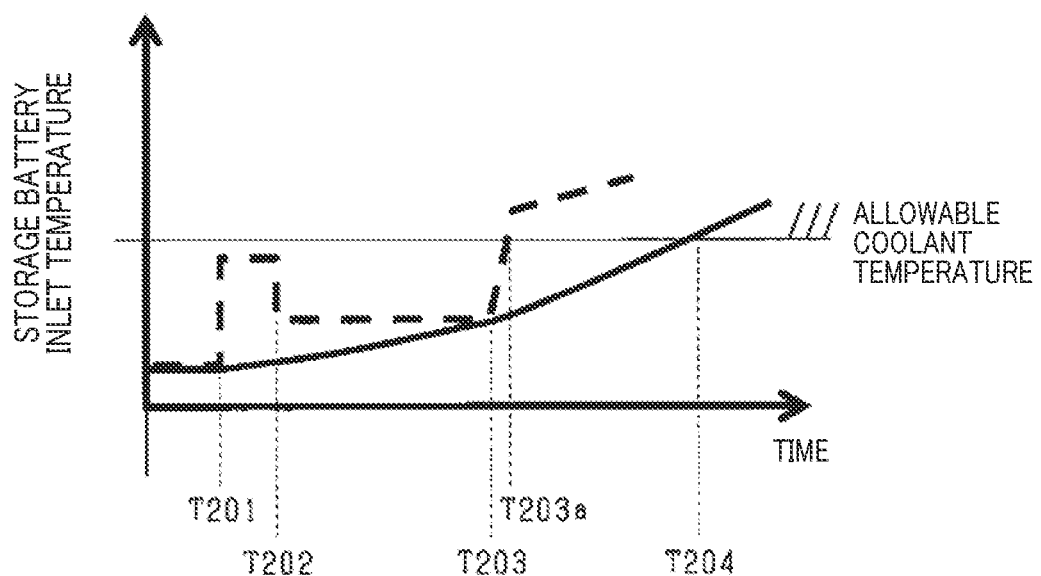
FIG. 14 is a diagram showing how a storage battery inlet temperature change.

Further, by providing the tank 100, as shown in FIG. 14, it is possible to moderate the temperature change in the storage battery inlet temperature as compared with the case where the tank 100 is not provided. The broken line in FIG. 14 indicates the temperature change in the case where the tank 100 is not provided, and the solid line indicates the temperature change in the case where the tank 100 is provided. The reason for the temporary increase in the storage battery inlet temperature from time point T201 to time point T202 indicated by the broken line in FIG. 14 can be considered that, after the connection, the high-temperature cooling water from the second cooling circuit 30 flows in without being mixed with the cooling water in the first cooling circuit 20. After a certain time, since the cooling water streams will be mixed, the storage battery inlet temperature will be kept low (from time point T202 to time point T203). After that, as the second coolant temperature rises, the storage battery inlet temperature rises and exceeds the allowable coolant temperature (time point T203a).

On the other hand, when the tank 100 is provided, after the connection, the high-temperature cooling water from the second cooling circuit 30 is temporarily stored in the tank 100 and gets mixed with the low-temperature cooling water, and then will be supplied to the storage battery cooling part 22. Therefore, as indicated by the solid line in FIG. 14, it is possible to moderate the change in the storage battery inlet temperature. In addition, the time for which the storage battery inlet temperature is kept equal to or lower than the allowable coolant temperature (from time point T201 to time point T204) can be increased as compared with the case where the tank 100 is not provided. As a result, the answer is more likely to be YES in steps S110 and S201, and the first cooling circuit 20 and the second cooling circuit 30 can be connected for a long time.

Figure 15:
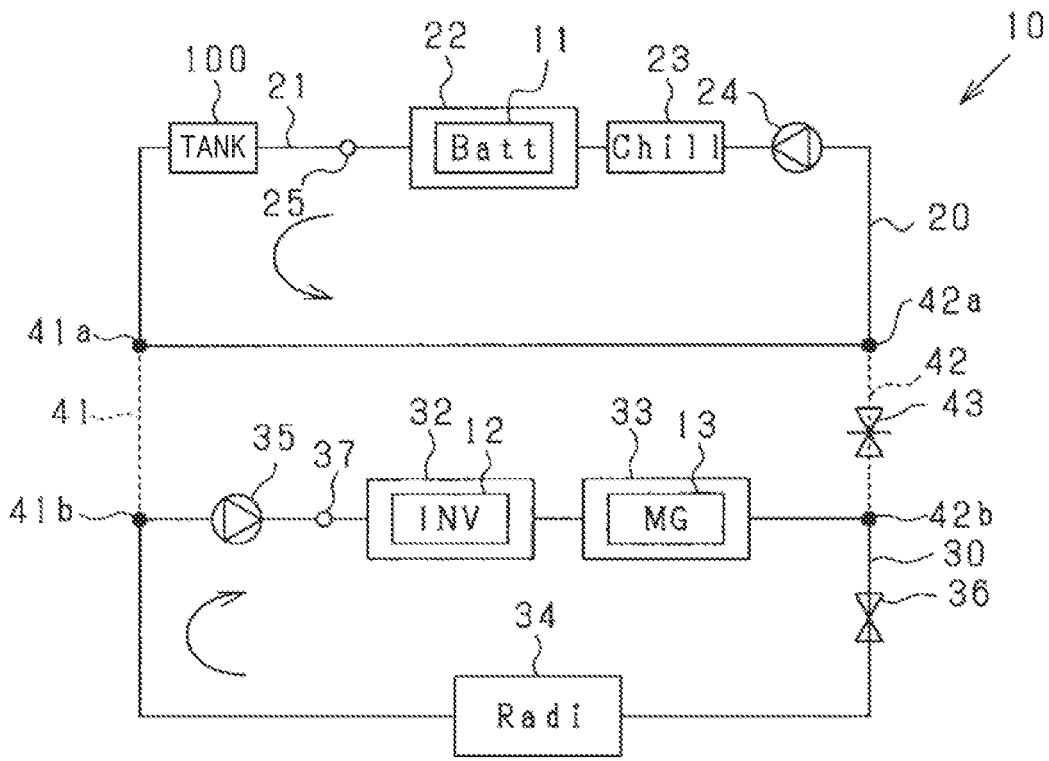
FIG. 15 is an overall view schematically showing a cooling system according to a comparative example.

The tank 100 is placed before the storage battery cooling part 22 and after the chiller 23. This makes it possible to moderate the temperature change in the storage battery inlet temperature as shown in FIG. 16 as compared with the case where the tank 100 is provided after the storage battery cooling part 22 as shown in FIG. 15.

Figure 16:
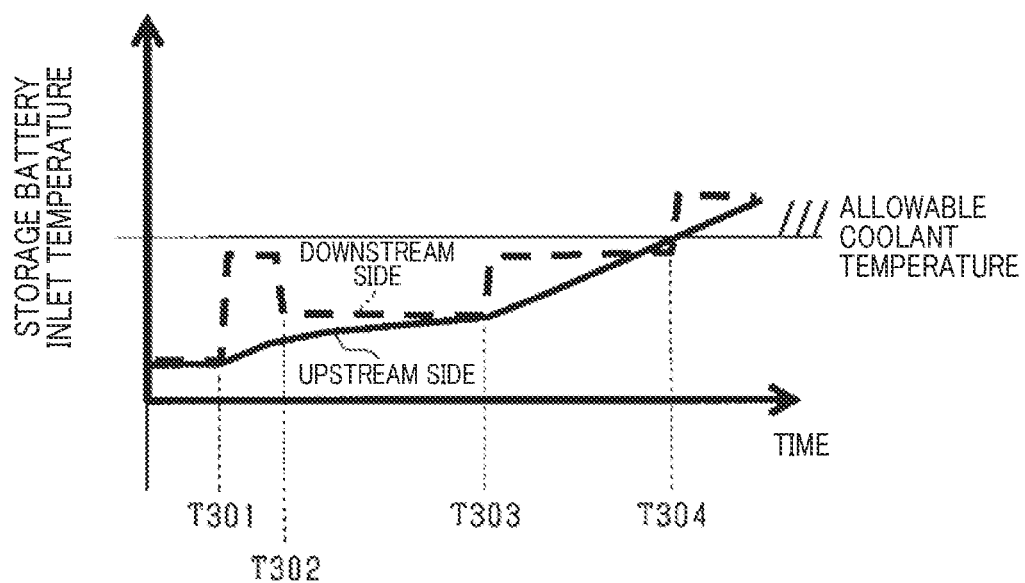
FIG. 16 is a diagram showing how a storage battery inlet temperature change.

The broken line (downstream side) in FIG. 16 indicates the temperature change in the case where the tank 100 is provided after the storage battery cooling part 22 (see FIG. 15), and the solid line (upstream side) indicates the temperature change in the case where the tank 100 is provided before the storage battery cooling part 22 (see FIG. 13). The reason for the temporary increase in the storage battery inlet temperature from time point T301 to time point T302 indicated by the broken line in FIG. 16 can be considered that, after the connection, the high-temperature cooling water from the second cooling circuit 30 flows in without being mixed with the cooling water in the first cooling circuit 20. After a certain time, since the cooling water streams will be mixed, the storage battery inlet temperature will be kept low (from time point T302 to time point T303). After that, as the second coolant temperature rises, the storage battery inlet temperature rises and exceeds the allowable coolant temperature (time point T304).

On the other hand, when the tank 100 is placed before the storage battery cooling part 22, after the connection, the high-temperature cooling water from the second cooling circuit 30 is temporarily stored in the tank 100 and gets mixed with the low-temperature cooling water, and then will be supplied to the storage battery cooling part 22. Therefore, as indicated by the solid line in FIG. 16, it is possible to moderate the change in the storage battery inlet temperature. In addition, even if the second coolant temperature rises, it is possible to moderate the increase in the storage battery inlet temperature as compared with the case where the tank 100 is provided before the storage battery cooling part 22. Note that, in this example, time point T304 at which the allowable coolant temperature is exceeded is substantially the same regardless of the position of the tank 100.

Variations of the Above-Described Embodiments

The above-described embodiments may be modified as described below. In this variation, the differences from the configurations described regarding the above embodiments will be described. Further, in this variation, unless otherwise specified, the description is given taking the configuration of the first embodiment as an example of the basic configuration.

In the above embodiments, the required amount of current of the inverter 12, the temperature of the cooling water, and the like are predicted, but they may not be predicted. Further, although how the necessary coolant temperature and the second coolant temperature change are predicted based on the changes in the first coolant flow rate and the second coolant flow rate, they may not be predicted.

For example, the ECU 50 may calculate the required amount of current of the inverter 12 at the present time, determine the necessary coolant temperature according to the required amount of current, and if the second coolant temperature at the present time is higher than the necessary coolant temperature, allow the cooling water to flow from the first coolant passage 21 to the second coolant passage 31. At this time, it is desirable that the greater the temperature difference between the second coolant temperature and the necessary coolant temperature, the greater the first coolant flow rate.

In the above embodiments, when the temperature difference between the second coolant temperature and the necessary coolant temperature is equal to or greater than a threshold value, the ECU 50 may control the first pump 24, the first valve 43, the second pump 35, and the second valve 36 so that the first coolant flow rate is maximized and the second coolant flow rate becomes zero. By increasing the first coolant flow rate and at the same time stopping the flow of the cooling water from the motor cooling part 33 to the radiator 34, it is possible to maximize the amount of cooling water flowing from the first cooling circuit 20 to the inverter cooling part 32 and rapidly lower the temperature of the cooling water. As a result, even when the second coolant temperature is high, the second coolant temperature can be quickly adjusted to the necessary coolant temperature.

In the above embodiments, when the temperature of the cooling water flowing into the radiator 34 is lower than the outside air temperature, the ECU 50 may control the second pump 35 and the second valve 36 so as to stop the flow of the cooling water into the radiator 34. That is, when the temperature of the coolant water flowing into the radiator 34 is lower than the outside air temperature, in other words, when the outside air temperature is higher, the temperature of the cooling water may rise if it is passed through the radiator 34. Since this may lead to the second coolant temperature also increasing, in such a case, the second coolant temperature can be efficiently reduced by stopping the flow of the cooling water into the radiator 34.

In the above embodiments, the type of the coolant is not limited to cooling water and may be changed as appropriate. A gas may be used.

In the above embodiments, the temperature prediction part 54 compares the chiller outlet temperature with the allowable coolant temperature. However, since the first coolant temperature, which is the temperature of the cooling water near the outlet of the storage battery cooling part 22, is naturally higher than the chiller outlet temperature, the first coolant temperature may be used instead of the chiller outlet temperature.

In the above embodiments, when the first coolant temperature is higher than the allowable coolant temperature, the cooling water is prevented from flowing from the first coolant passage 21 to the second coolant passage 31. However, if it is a short time, the cooling water may be allowed to flow until the predicted period ends.

In the above embodiments, the ECU 50 predicts the chiller outlet temperature based on the first coolant flow rate by referring to the battery temperature map. However, it may not predict the chiller outlet temperature. The decision may be made based on an acquired chiller outlet temperature. Further, for example, steps S104 and S105 may be omitted.

In the above embodiments, the ECU 50 predicts the rise time until the temperature of the storage battery 11 reaches the allowable battery temperature value, and if the predicted rise time is determined to be longer than the time until the predicted period ends, it prevents the cooling water from flowing from the first coolant passage 21 to the second coolant passage 31. As another example, the rise time and the predicted period may not be determined. For example, steps S106 and S107 may be omitted.

In the above embodiments, the ECU 50 determines whether the predicted rise time is longer than the time until the predicted period ends. It is also possible to determine whether the predicted rise time is longer than the time until the required amount of current of the inverter 12 reaches the maximum value.

In the above embodiments, the order in which steps S104 and S105 and steps S106 and S107 are performed may be changed.

In the above embodiments, the ECU 50 as the heat exchanger control part 56 controls only the cooling performance of the chiller 23, but the cooling performance of the radiator 34 may be controlled instead of that of the chiller 23. Alternatively, the cooling performance of the chiller 23 and the cooling performance of the radiator 34 may be controlled.

Figure 8A:
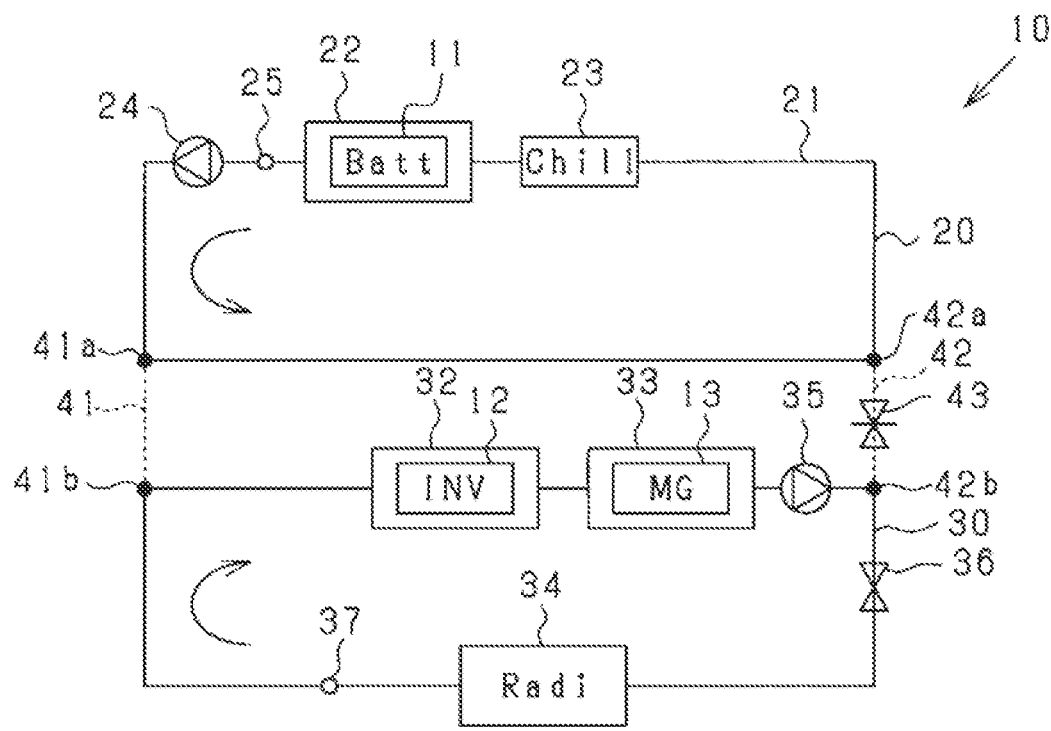
FIG. 8A is an overall view schematically showing a cooling system according to another example.
Figure 8B:
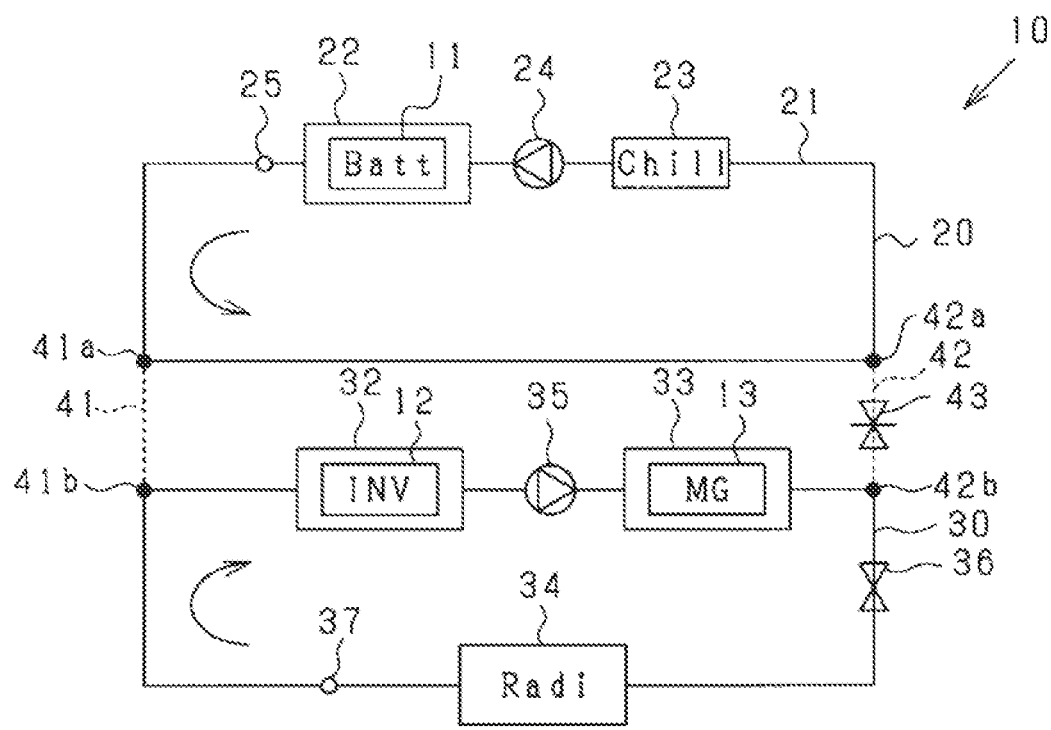
FIG. 8B is an overall view schematically showing a cooling system according to another example.
Figure 9A:
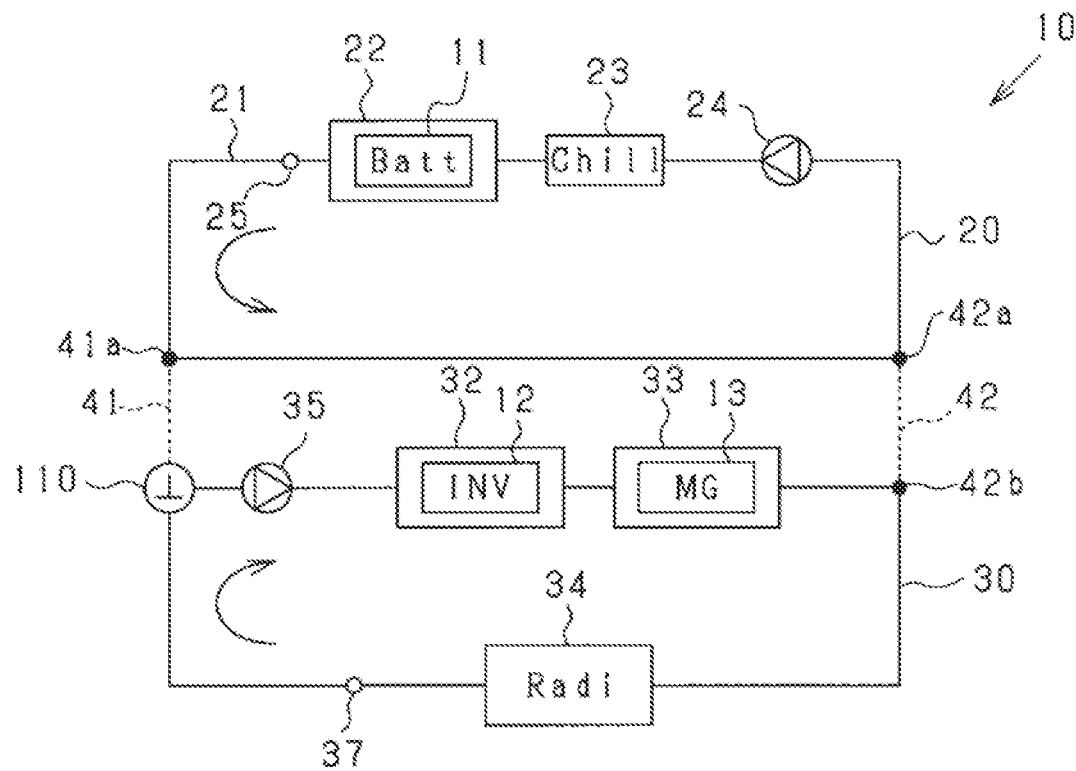
FIG. 9A is an overall view schematically showing a cooling system according to another example.
Figure 9B:
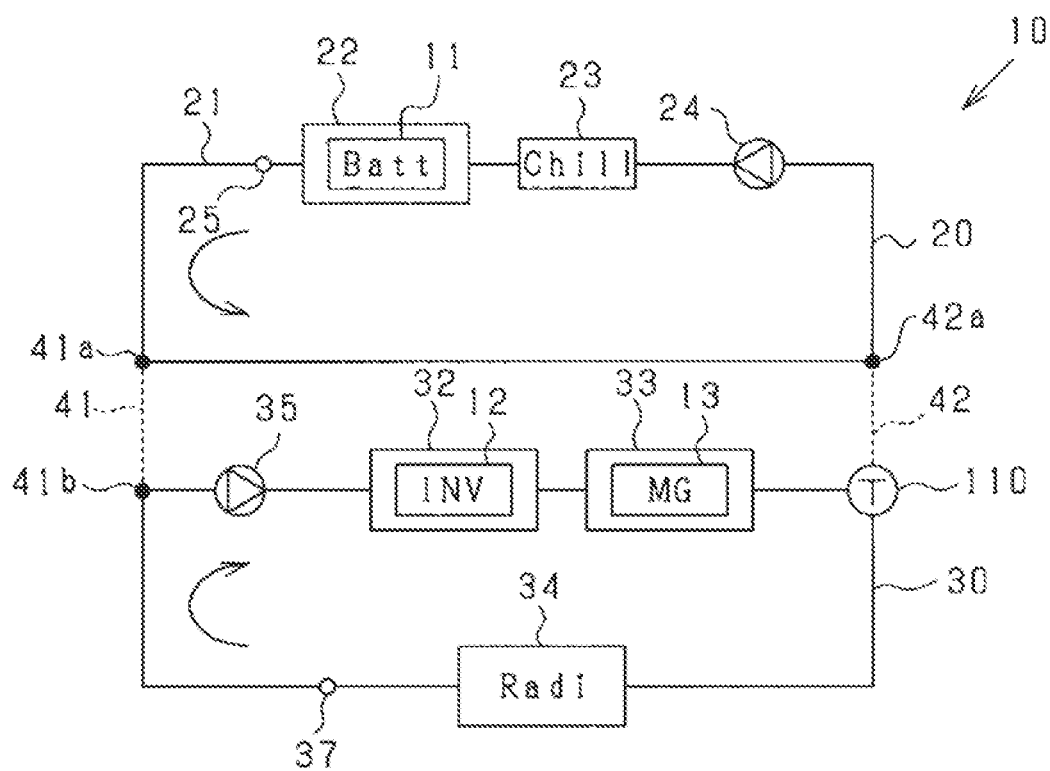
FIG. 9B is an overall view schematically showing a cooling system according to another example.

In the above embodiments, the positions of the first pump 24, the first valve 43, the second pump 35, and the second valve 36 may be changed as appropriate. For example, they may be arranged as shown in FIGS. 8A and 8B. A three-way valve may replace the first valve 43 and the second valve 36. For example, in FIG. 9A, a three-way valve 110 is provided at the connection point between the first connection path 41 and the second coolant passage 31. In FIG. 9B, the three-way valve 110 is provided at the connection point between the second connection path 42 and the second coolant passage 31.

Figure 10:
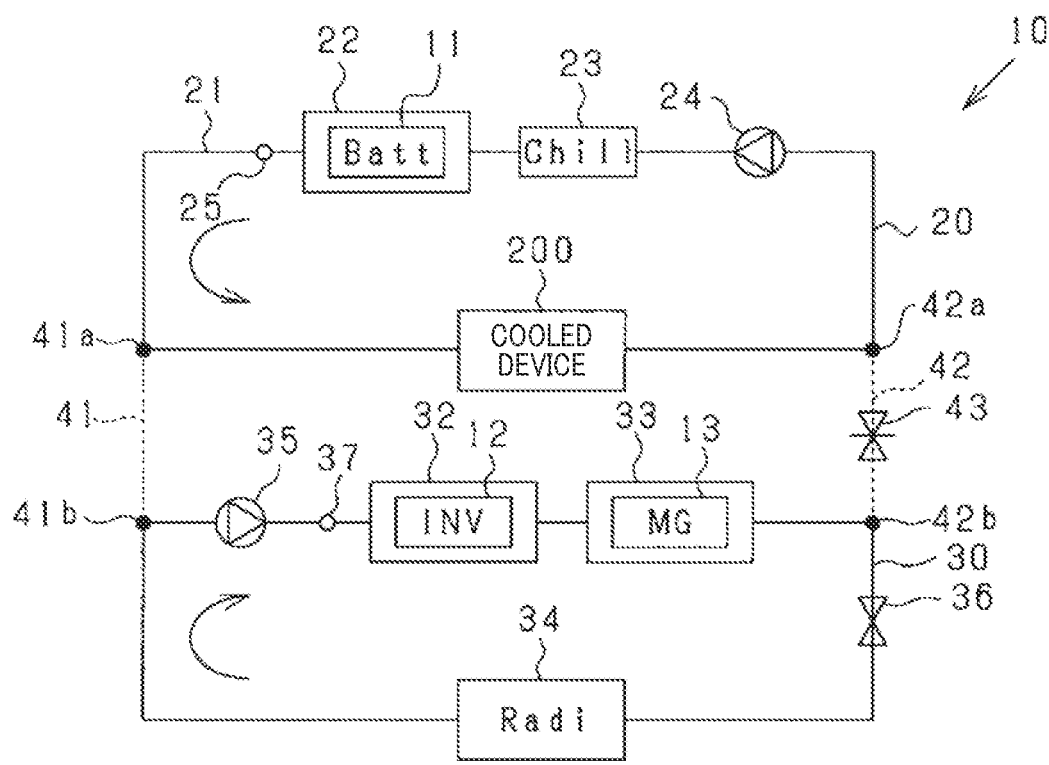
FIG. 10 is an overall view schematically showing a cooling system according to another example.

In the first cooling circuit 20 of the above embodiments, as shown in FIG. 10, a cooled device 200 may be provided as a cooling target in addition to the storage battery 11. The cooled device 200 is, for example, a device involved in charging, a CPU, or the like.

In the above embodiments, the inverter 12 may be integrated with a DC-to-DC converter. The inverter 12 may be integrated with the motor 13. The motor 13 may be omitted and only the inverter 12 may be provided. Only the motor 13 or a converter may be provided. These components all correspond to the electric drive unit. The term "electric drive unit" refers to, for example, a power control unit (PCU).

In the above embodiments, the ECU 50 may determine whether a predetermined time has elapsed after establishing the connection between the first cooling circuit 20 and the second cooling circuit 30, and if the predetermined time has elapsed, the connection may be terminated. That is, the process may proceed to step S111.

In the above embodiments, the procedures of steps S120 to 121 may be omitted.

The inverter current amount map in the above embodiments may be calculated using the second coolant temperature, the voltage of the storage battery 11, and the carrier frequency as parameters. The carrier frequency is calculated based on a carrier frequency map using the rotation speed of the motor 13 and the output torque (applied current) of the motor 13 as parameters.

In the flow rate map of the above embodiments, the flow rate at each part may be calculated using parameters such as a pressure drop map of each part, a pump output map, a valve pressure drop map, the temperature at each part, and the valve position. Similarly, in the cooling water temperature map, the second coolant temperature may be calculated using the first coolant flow rate, the second coolant flow rate, the radiator outlet temperature, and the first coolant temperature as parameters. The radiator outlet temperature may be calculated using a radiator heat dissipation performance map, the radiator inlet temperature, the second coolant flow rate, and the outside air conditions (temperature, humidity, atmospheric pressure) as parameters. The radiator inlet temperature may be calculated using the motor outlet temperature at the outlet of the motor cooling part 33 as a parameter. The motor outlet temperature may be calculated using the motor inlet temperature at the inlet of the motor cooling part 33 and the heat release temperature of the motor 13 as parameters. The heat release temperature of the motor 13 may be calculated using a motor heat-release amount map, the temperature of the motor 13, the inverter flow rate, and the inverter outlet temperature as parameters. The inverter outlet temperature may be calculated using the inverter inlet temperature and the heat release temperature of the inverter 12 as parameters. The heat release temperature of the inverter 12 may be calculated using an inverter loss map, the inverter current, the carrier frequency, the battery voltage, the inverter flow rate, and the inverter inlet temperature as parameters.

In the above embodiments, the first coolant temperature may be calculated using the battery heat release temperature and the storage battery inlet temperature, which is the temperature at the inlet of the storage battery cooling part 22, as parameters. The battery heat release temperature may be calculated using a battery heat-release amount map, the battery body temperature of the storage battery 11, the chiller outlet temperature, and the amount or current from the storage battery 11 as parameters. The chiller outlet temperature may be calculated using the chiller heat absorption amount, the inverter inlet temperature, and the amount of current from the storage battery 11 as parameters. The inverter inlet temperature may be calculated using parameters such as the motor outlet temperature and the first coolant flow rate.

In the above embodiments, the increase in temperature may be calculated using the storage battery inlet temperature, which is the temperature at the inlet of the storage battery cooling part 22, the amount of current, the battery body temperature of the storage battery 11, a battery heat-release amount map, the heat capacity of the storage battery 11, and the battery temperature upper limit of the storage battery 11 as parameters.

In the third embodiment described above, there may be more than one tank 100. The position of the tank 100 may be changed as appropriate in the first cooling circuit 20. For example, as shown in FIG. 15, it may be placed after the storage battery cooling part 22 and before the first connection point 41*a*.

In the third embodiment described above, the tank 100 may be covered with a heat insulating material to provide a heat retaining function for maintaining the temperature of the cooling water.

Figure 17:
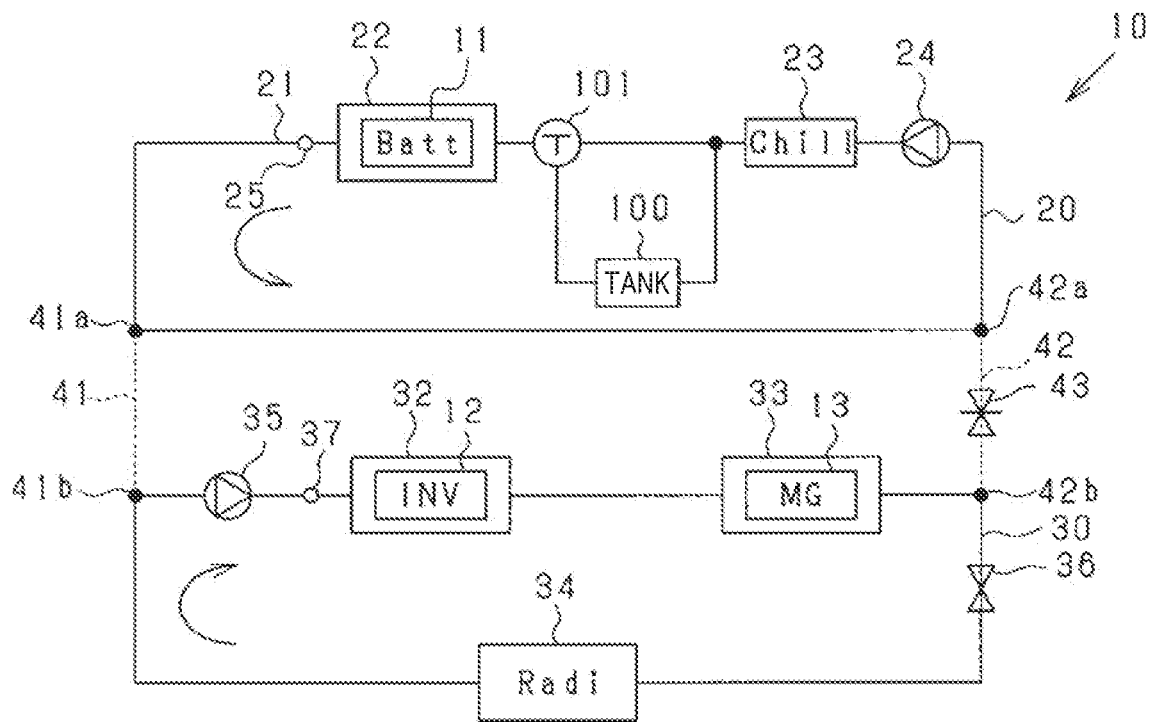
FIG. 17 is an overall view schematically showing a cooling system according to another example.

In the third embodiment described above, the tank 100 is connected in series with the chiller 23 and the storage battery cooling part 22. However, it may be connected in parallel with the first coolant passage 21 connecting the chiller 23 and the storage battery cooling part 22. For example, they may be arranged as shown in FIG. 17. The ECU 50 may control the valve 101 to control the inflow and outflow of the cooling water between the first coolant passage 21 and the tank 100. The position of the valve 101 can be changed as appropriate.

Figure 18:
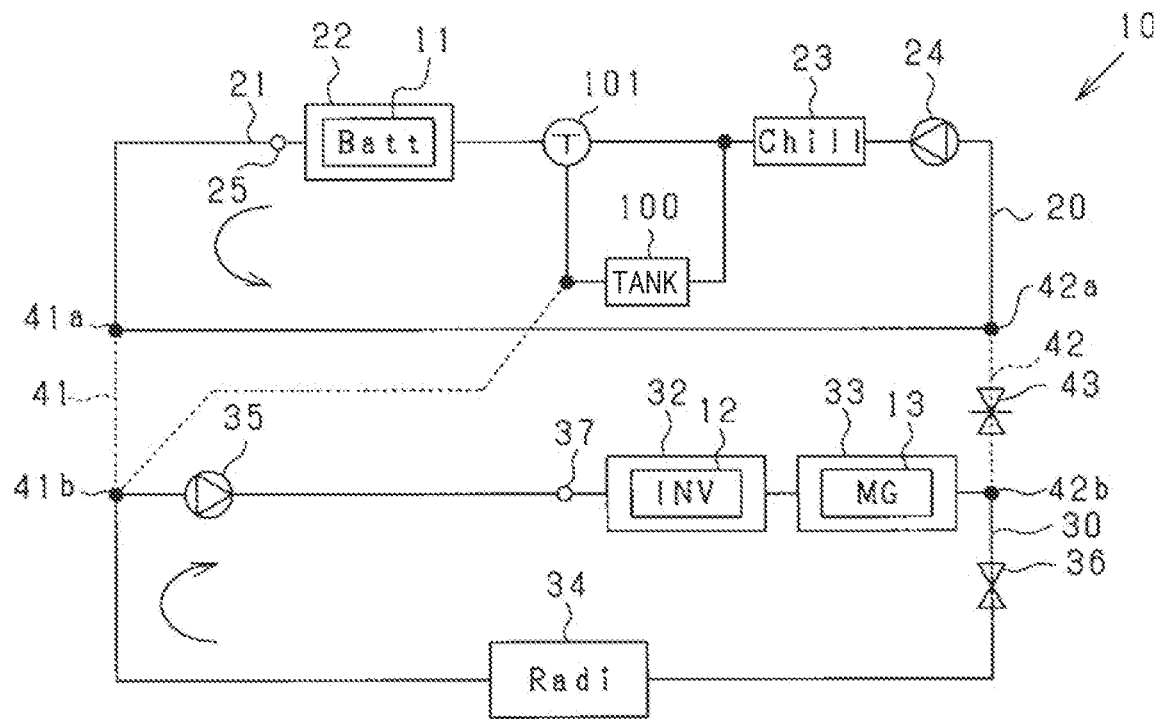
FIG. 18 is an overall view schematically showing a cooling system according to another example.

Further, for example, the tank 100 may be positioned and connected as shown in FIG. 18. That is, similarly to FIG. 17, the tank 100 may be connected in parallel, and the tank 100 may also be connected to the second coolant passage 31. In FIG. 18, it is connected to the second connection point 41*b* in the second coolant passage 31. The ECU 50 may control the valve 101 to allow the cooling water to flow from the tank 100 to the second coolant passage 31.

That is, when the second coolant temperature is higher than the necessary coolant temperature, the ECU 50 may control the valve 101 so as to supply the stored cooling water from the tank 100 to the second coolant passage 31. In FIG. 18, the ECU 50 functions as a storage control part, and the valve 101 functions as an adjustment part that adjusts the amount of inflow and the amount of outflow of the cooling water of the tank 100. This makes it possible to reduce the second coolant temperature while suppressing the increase in the first coolant temperature. The number and position of the valve 101 can be changed as appropriate.

In the above embodiments, when the answer is NO in step S109 (when the second coolant temperature≤the necessary coolant temperature), the ECU 50 proceeds to step S111 and terminates the connection between the first cooling circuit 20 and the second cooling circuit 30. As another example, when the answer is NO in step S109, the ECU 50 may determine whether the predicted period has ended, and proceed to step S111 if the answer is YES.

In the first cooling circuit 20 of the above embodiments, the diameter of the part of the first coolant passage 21 before the storage battery cooling part 22 and after the chiller 23 may be increased as compared with the diameter of the rest of the first coolant passage 21. This increases the capacity of the part of the first coolant passage 21 before the storage battery cooling part 22 and after the chiller 23. As a result, as in the case where the tank 100 is provided, the second coolant temperature can be reduced while suppressing the increase in the first coolant temperature. Further, as in the case where the tank 100 is provided, the rise in the first coolant temperature can be moderated.

The control parts and their methods described herein may be realized by a dedicated computer provided by configuring a processor and a memory programmed to execute one or more functions embodied by computer programs. Alternatively, the control parts and their methods described herein may be realized by a dedicated computer provided by configuring a processor with one or more dedicated hardware logic circuits. Alternatively, the control parts and their methods described herein may be realized by one or more dedicated computers configured by combining a processor and a memory programmed to execute one or more functions with a processor configured by one or more hardware logic circuits. The computer programs may be stored in a computer-readable, non-transitional tangible recording medium as instructions executed by the computer.

Although the present disclosure is described based on examples, it should be understood that the present disclosure is not limited to the described examples and structures. The present disclosure encompasses various variations as well as changes within the scope of equivalence. In addition, the scope and the spirit of the present disclosure encompass various combinations and modes, and other combinations and modes including only one element thereof, and combinations and modes having more or less elements.

What is claimed is:

1. A cooling control device configured to control a cooling system having a first cooling circuit that cools a cooling target and a second cooling circuit that cools an electric drive unit, the cooling system comprising:
a first coolant passage provided in the first cooling circuit configured to circulate a coolant between a first cooling part configured to cool the cooling target and a first heat exchanger;
a second coolant passage provided in the second cooling circuit configured to circulate a coolant between an electric drive unit cooling part configured to cool the electric drive unit and a second heat exchanger, the first heat exchanger and the second heat exchanger each being a device that releases heat from the coolant, and the first heat exchanger being configured to lower a temperature of the coolant so that the temperature of the coolant after releasing heat is lower than a temperature of the coolant whose heat has been released by the second heat exchanger;
a connection path configured to connect the first coolant passage and the second coolant passage provided between the first coolant passage and the second coolant passage;
a first path control device distributed in the first coolant passage and the connection path, the first path control device being configured to control a coolant flow in the connection path; and
a second path control device provided in the second coolant passage, the second path control device being configured to control a coolant flow from the electric drive unit cooling part to the second heat exchanger, and the cooling control device comprising a processor and a memory storing a program, the processor executing the program to:
calculate a required amount of current of the electric drive unit;
determine a necessary coolant temperature, which is a temperature of the coolant to flow in the second coolant passage, according to the calculated required amount of current;
acquire, as a second coolant temperature, a temperature of the coolant in the second coolant passage after being supplied from the second heat exchanger and before being supplied to the electric drive unit cooling part;

when the second coolant temperature is higher than the determined necessary coolant temperature, control the first path control device so that the coolant flows from the first coolant passage to the second coolant passage via the connection path;

acquire, as a first coolant temperature, a temperature of the coolant flowing in the first coolant passage;

adjust a first coolant flow rate from the first coolant passage to the second coolant passage and a second coolant flow rate from the electric drive unit cooling part to the second heat exchanger based on (i) the necessary coolant temperature, (ii) the first coolant temperature, (iii) the second coolant temperature, and (iv) a flow map that defines at least relations of the necessary coolant temperature, the first coolant flow rate, and the second coolant flow rate; and control the first path control device based on the first coolant flow rate and the second path control device based on the second coolant flow rate.

2. The cooling control device according to claim 1, wherein when a temperature difference between the necessary coolant temperature and the second coolant temperature is equal to or greater than a threshold value, the processor controls the second path control device so as to (i) stop the coolant flow from the electric drive unit cooling part to the second heat exchanger and (ii) cause all the coolant supplied from the first coolant passage to the second coolant passage via the connection path to flow into the electric drive unit cooling part.

3. The cooling control device according to claim 1, wherein the second heat exchanger is a radiator that causes a coolant and an outside air to exchange heat, and when a temperature of a coolant flowing into the second heat exchanger is lower than an outside air temperature, the processor controls the second path control device so as to stop the coolant flow from the electric drive unit cooling part to the second heat exchanger.

4. The cooling control device according to claim 1, wherein the processor predicts and calculates the required amount of current of the electric drive unit based on (i) a situation a vehicle to which the cooling system is mounted is in and (ii) a predicted period during which the required amount of current is predicted to be higher than a predetermined threshold value based on the situation, the situation being identified based on vehicle information including at least one of speed of the vehicle, an operation amount of an accelerator of the vehicle, and an operation amount of a brake of the vehicle.

5. The cooling control device according to claim 1, wherein when the first coolant temperature is higher than an allowable coolant temperature as a coolant for cooling the cooling target, the processor controls the first path control device so that the coolant does not flow from the second coolant passage to the first coolant passage.

6. The cooling control device according to claim 1, wherein the processor is configured to predict the first coolant temperature when the second coolant temperature reaches the necessary coolant temperature, and when the predicted first coolant temperature is higher than an allowable coolant temperature as a coolant for cooling the cooling target, the processor controls the first path control device so that the coolant does not flow from the second coolant passage to the first coolant passage.

7. The cooling control device according to claim 6, wherein when the predicted first coolant temperature is higher than the allowable coolant temperature as a coolant for cooling the cooling target, the processor controls the first heat exchanger or the second heat exchanger so as to improve a cooling capacity of the first heat exchanger or the second heat exchanger.

8. The cooling control device according to claim 1, wherein the processor is configured to predict a rise time until a temperature of the cooling target reaches an allowable temperature value, the processor predicts the required amount of current of the electric drive unit based on (i) a situation a vehicle to which the cooling system is mounted is in and (ii) a predicted period during which the required amount of current is predicted to be higher than a predetermined threshold value based on the situation, the situation being identified based on vehicle information including at least one of speed of the vehicle, an operation amount of an accelerator of the vehicle, and an operation amount of a brake of the vehicle, and when it is determined that the predicted rise time is shorter than a time until the predicted period ends, the processor controls the first path control device so that the coolant does not flow from the first coolant passage to the second coolant passage.

9. The cooling control device according to claim 8, wherein the processor is configured to, when the predicted rise time is determined to be shorter than a time until the predicted period ends, control the first heat exchanger or the second heat exchanger so as to improve a cooling capacity of the first heat exchanger or the second heat exchanger.

10. The cooling control device according to claim 1, wherein the first cooling circuit is provided with a coolant storage part that stores the coolant.

11. The cooling control device according to claim 10, wherein the coolant storage part is placed before the first cooling part and after the first heat exchanger in the first coolant passage, and at least part of a coolant whose heat has been released by the first heat exchanger is temporarily stored in the coolant storage part.

12. The cooling control device according to claim 10, wherein the processor is configured to control an adjustment part that adjusts an amount of inflow and an amount of outflow of the coolant to and from the storage part, and when the second coolant temperature is higher than the determined necessary coolant temperature, the processor controls the adjustment part so as to supply the stored coolant from the coolant storage part to the first coolant passage or the second coolant passage.

13. The cooling control device according to claim 1, wherein in the first cooling circuit, a diameter of a part of the first coolant passage before the first cooling part and after the first heat exchanger is increased as compared with a diameter of the rest of the first coolant passage.

14. A cooling system comprising:
a first cooling circuit having a first cooling part configured to cool a cooling target, a first heat exchanger, and a first coolant passage in which a coolant circulates between the first cooling part and the first heat exchanger;
a second cooling circuit having an electric drive unit cooling part configured to cool an electric drive unit, a second heat exchanger, and a second coolant passage in which a coolant circulates between the electric drive unit cooling part and the second heat exchanger;
a connection path configured to connect the first coolant passage and the second coolant passage;
a first path control device distributed in the first coolant passage and the connection path, the first path control device being configured to control a coolant flow through the connection path;
a second path control device provided in the second coolant passage, the second path control device being configured to control a coolant flow from the electric drive unit cooling part to the second heat exchanger; and
a cooling control device configured to control the first path control device and the second path control device, wherein
the first heat exchanger and the second heat exchanger are each a device that releases heat from the coolant, and the first heat exchanger is configured to lower a temperature of the coolant so that the temperature of the coolant after releasing heat is lower than a temperature of the coolant whose heat has been released by the second heat exchanger, and
the cooling control device comprises a processor and a memory storing a program, the processor executing the program to:
calculate a required amount of current of the electric drive unit unit;
determine a necessary coolant temperature, which is a temperature of the coolant to flow in the second coolant passage, according to the calculated required amount of current;
acquire, as a second coolant temperature, a temperature of the coolant in the second coolant passage after being supplied from the second heat exchanger and before being supplied to the electric drive unit cooling part;
when the second coolant temperature is higher than the determined necessary coolant temperature, control the first path control device so that the coolant flows from the first coolant passage to the second coolant passage;
acquire, as a first coolant temperature, a temperature of the coolant flowing in the first coolant passage;
adjust a first coolant flow rate from the first coolant passage to the second coolant passage and a second coolant flow rate from the electric drive unit cooling part to the second heat exchanger based on (i) the necessary coolant temperature, (ii) the first coolant temperature, (iii) the second coolant temperature, and (iv) a flow map that defines at least relations of the necessary coolant temperature, the first coolant flow rate, and the second coolant flow rate; and
control the first path control device based on the first coolant flow rate and the second path control device based on the second coolant flow rate.

15. A non-transitory computer-readable storage medium storing a program executed by a cooling control device configured to control a cooling system having a first cooling circuit that cools a cooling target and a second cooling circuit that cools an electric drive unit,
the cooling system comprising:
a first coolant passage provided in the first cooling circuit configured to circulate a coolant between a first cooling part configured to cool the cooling target and a first heat exchanger;
a second coolant passage provided in the second cooling circuit configured to circulate a coolant between an electric drive unit cooling part configured to cool the electric drive unit and a second heat exchanger,
the first heat exchanger and the second heat exchanger each being a device that releases heat from the coolant, and the first heat exchanger being configured to lower a temperature of the coolant so that the temperature of the coolant after releasing heat is lower than a temperature of the coolant whose heat has been released by the second heat exchanger;
a connection path configured to connect the first coolant passage and the second coolant passage is provided between the first coolant passage and the second coolant passage;
a first path control device distributed in the first coolant passage and the connection path, the first path control device being configured to control a coolant flow through the connection path; and
a second path control device provided in the second coolant passage, the second path control device being configured to control a coolant flow from the electric drive unit cooling part to the second heat exchanger, and
the program causing the cooling control device to:
calculate a required amount of current of the electric drive;
determine a necessary coolant temperature, which is a temperature of the coolant to flow in the second coolant passage, according to the calculated required amount of current;
acquire, as a second coolant temperature, a temperature of the coolant in the second coolant passage after being supplied from the second heat exchanger and before being supplied to the electric drive unit cooling part;
when the second coolant temperature is higher than the determined necessary coolant temperature, control the first path control device so that the coolant flows from the first coolant passage to the second coolant passage via the connection path;
acquire, as a first coolant temperature, a temperature of the coolant flowing in the first coolant passage;
adjust a first coolant flow rate from the first coolant passage to the second coolant passage and a second coolant flow rate from the electric drive unit cooling part to the second heat exchanger based on (i) the necessary coolant temperature, (ii) the first coolant temperature, (iii) the second coolant temperature, and (iv) a flow map that defines at least relations of the necessary coolant temperature, the first coolant flow rate, and the second coolant flow rate; and
control the first path control device based on the first coolant flow rate and the second path control device based on the second coolant flow rate.

16. A control method performed by a cooling control device configured to control a cooling system having a first cooling circuit that cools a cooling target and a second cooling circuit that cools an electric drive unit, the cooling system comprising:
- a first coolant passage provided in the first cooling circuit configured to circulate a coolant between a first cooling part configured to cool the cooling target and a first heat exchanger;
- a second coolant passage provided in the second cooling circuit configured to circulate a coolant between an electric drive unit cooling part configured to cool the electric drive unit and a second heat exchanger, the first heat exchanger and the second heat exchanger each being a device that releases heat from the coolant, and the first heat exchanger being configured to lower a temperature of the coolant so that the temperature of the coolant after releasing heat is lower than a temperature of the coolant whose heat has been released by the second heat exchanger;
- a connection path configured to connect the first coolant passage and the second coolant passage is provided between the first coolant passage and the second coolant passage;
- a first path control device distributed in the first coolant passage and the connection path, the first path control device being configured to control a coolant flow in the connection path; and
- a second path control device provided in the second coolant passage, the second path control device being configured to control a coolant flow from the electric drive unit cooling part to the second heat exchanger, and the method comprising:
- calculating a required amount of current of the electric drive;
- determining a necessary coolant temperature, which is a temperature of the coolant to flow in the second coolant passage, according to the calculated required amount of current;
- acquiring, as a second coolant temperature, a temperature of the coolant in the second coolant passage after being supplied from the second heat exchanger and before being supplied to the electric drive unit cooling part;
- when the second coolant temperature is higher than the determined necessary coolant temperature, controlling the path control device so that the coolant flows from the first coolant passage to the second coolant passage;
- acquiring, as a first coolant temperature, a temperature of the coolant flowing in the first coolant passage;
- adjusting a first coolant flow rate from the first coolant passage to the second coolant passage and a second coolant flow rate from the electric drive unit cooling part to the second heat exchanger based on (i) the necessary coolant temperature, (ii) the first coolant temperature, (iii) the second coolant temperature, and (iv) a flow map that defines at least relations of the necessary coolant temperature, the first coolant flow rate, and the second coolant flow rate; and
- controlling the first path control device based on the first coolant flow rate and the second path control device based on the second coolant flow rate.

* * * * *